United States Patent
Li et al.

(10) Patent No.: US 7,627,033 B2
(45) Date of Patent: Dec. 1, 2009

(54) VIDEO RATE CONTROL

(75) Inventors: Jiang Li, Beijing (CN); Keman Yu, Beijing (CN); Shipeng Li, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 1032 days.

(21) Appl. No.: 10/988,715

(22) Filed: Nov. 15, 2004

(65) Prior Publication Data

US 2006/0104346 A1 May 18, 2006

(51) Int. Cl.
*H04N 7/12* (2006.01)
*H04N 11/02* (2006.01)
*H04N 11/04* (2006.01)

(52) U.S. Cl. ............... 375/240.01; 375/240.23; 348/14.01

(58) Field of Classification Search .......... 375/240
See application file for complete search history.

(56) References Cited

U.S. PATENT DOCUMENTS

| | | | |
|---|---|---|---|
| 5,847,760 A | 12/1998 | Elmaliach et al. | |
| 6,111,896 A | 8/2000 | Slattery et al. | |
| 6,236,759 B1 * | 5/2001 | Horie et al. | 382/244 |
| 6,265,997 B1 * | 7/2001 | Nomizu | 341/107 |
| 7,085,268 B2 | 8/2006 | Fukuda et al. | |
| 7,099,954 B2 | 8/2006 | Li et al. | |
| 2002/0006225 A1 * | 1/2002 | Kimura et al. | 382/200 |
| 2002/0044528 A1 | 4/2002 | Pogrebinsky et al. | |
| 2002/0087761 A1 | 7/2002 | Clapp et al. | |
| 2002/0126755 A1 | 9/2002 | Li et al. | |
| 2004/0013311 A1 * | 1/2004 | Hirao | 382/240 |
| 2004/0100586 A1 | 5/2004 | Li et al. | |
| 2004/0252893 A1 * | 12/2004 | Togashi | 382/232 |
| 2004/0264377 A1 | 12/2004 | Kilkki et al. | |

OTHER PUBLICATIONS

J. Li, G. Chen, J. Xu, Y. Wang, H. Zhou, K. Yu, K.T. Ng and H.Y. Shum, "Bi-level video: video communication at very low bit rates," in Proc. Of the 9th ACM International Conference on Multimedia, 2001, pp. 392-400 (printed from ACM website as pages 1-29).

(Continued)

*Primary Examiner*—Andy S. Rao
*Assistant Examiner*—Jessica Roberts
(74) *Attorney, Agent, or Firm*—Lee & Hayes, PLLC

(57) ABSTRACT

A model-based rate control mechanism involves the percentage of less probable symbols (LPS). The mechanism is first described in the context of bi-level video and subsequently extended for multi-level video by applying it to individual bit planes thereof. A model parameter represents a relationship between an LPS reduction ratio and a bit-count reduction ratio. The model parameter thusly facilitates transforming a targeted bit-count into an LPS reduction ratio. The LPS reduction ratio can be attained by adjusting a threshold band half-width wherein LPS pixels within the threshold band are converted to more probable symbols (MPSs). In a described implementation, a threshold band half-width is set so as to achieve a desired LPS reduction ratio. The desired LPS reduction ratio is determined based on a desired bit-count reduction ratio and the model parameter. The desired bit-count reduction ratio is determined using a bit plane complexity value and a targeted bit-count.

23 Claims, 15 Drawing Sheets

GRAY-SCALE IMAGE — 102

BI-LEVEL IMAGE — 104

OTHER PUBLICATIONS

J. Li, K. Yu, T. He, Y. Lin, S. Li and Q. Zhang, "Scalable Portrait Video for Mobile Video Communication," IEEE Transactions on Circuits and Systems for Video Technology, vol. 13, No. 5, pp. 376-384, May 2003.

C.E. Shannon, "A Mathematical Theory of Communication," Bell System Tech. Journal 27:379-423, 623-656, 1948.

"N3675," Int'l. Organisation for Standardisation, ISO/IEC JTC1/SC29/WG11, Coding of Moving Pictures and Audio, Optimization Model, Version 2.0, La Baule, Oct. 2000, 12 pages.

Ian H. Witten, Radford M. Neal, & John G. Cleary, "Arithmetic Coding for Data Compression," Communications of the ACM, Jun. 1987, vol. 30, No. 6, pp. 520-540.

U.S. Appl. No. 09/844,549, filed Apr. 28, 2001, "A System and Process for Broadcast and Communication with Very Low Bit-Rate Bi-Level or Sketch Video,".

U.S. Appl. No. 10/302,653, filed Nov. 22, 2002, "A System and Method for Scalable Portrait Video.".

Li, et al., "Portrait Video Phone", ACM, 2001, pp. 1-2.

* cited by examiner

GRAY-SCALE IMAGE

BI-LEVEL IMAGE

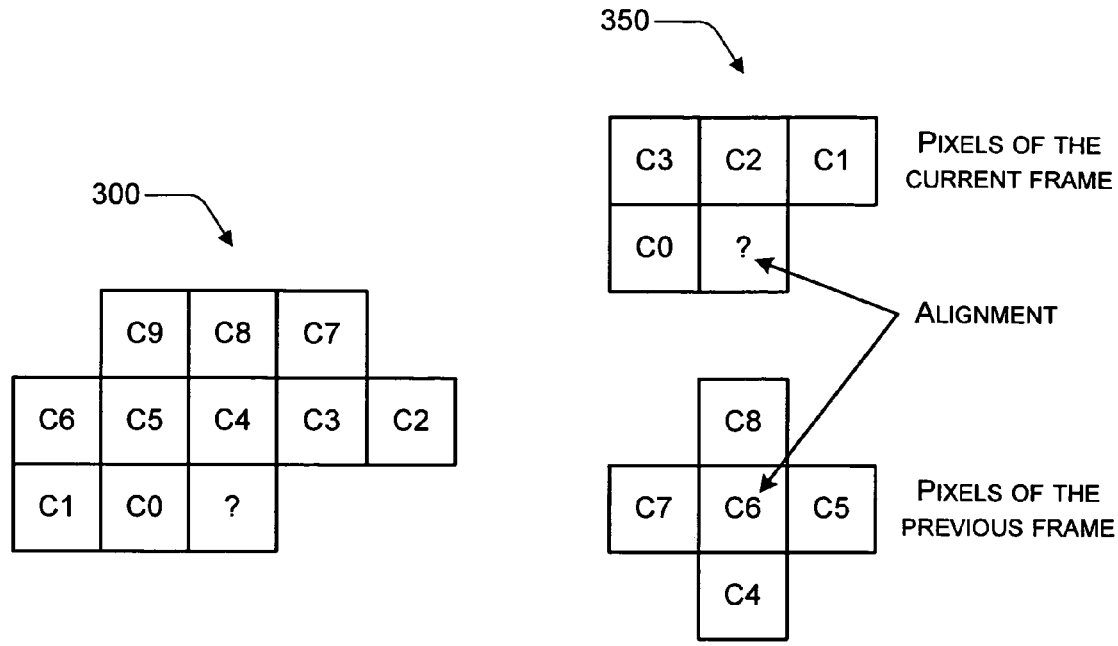
FIG. 3A
FIG. 3B
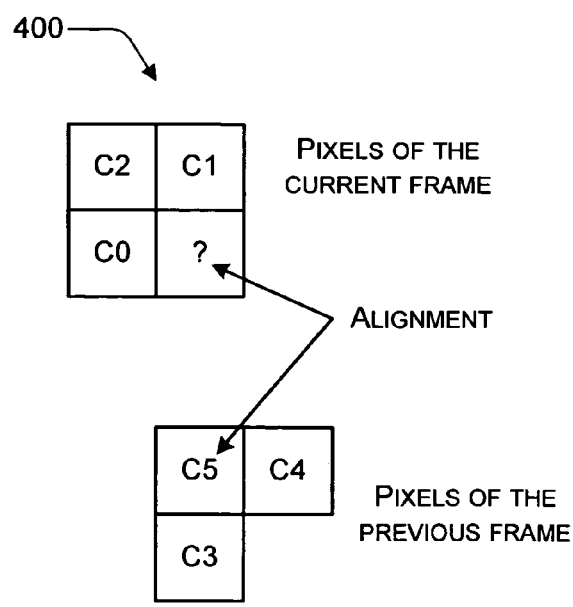
FIG. 4

BIT-RATE ESTIMATIONS AND CORRESPONDING ENCODINGS

LPS Rate Model Stability and Uniformity Verification

BIT-COUNT ESTIMATION WITH DIFFERENT WIDTHS OF THRESHOLD BAND

BIT-COUNT ESTIMATION OF MULTI-LEVEL VIDEO

APPLYING THIS WORK
OF MODEL-BASED
VIDEO RATE CONTROL
TO SAMPLE VIDEO SEQUENCE

VIDEO RATE CONTROL

TECHNICAL FIELD

This disclosure relates in general to video rate control and in particular, by way of example but not limitation, to a model-based rate control mechanism involving the percentage of less probable symbols (LPS) and based on a principle of entropy coding.

BACKGROUND

Recent years have witnessed the rapid development of wireless networks and mobile devices. General Packet Radio Service (GPRS) and Code Division Multiple Access (CDMA 1X) as 2.5G solutions to wide areas are available in increasingly greater regions. Wireless LAN 802.11 and Bluetooth have also grown quickly for local area wireless networks. At the same time, mobile devices have increasingly gained in processing power, storage capacity, and battery life. These evolutions have made mobile video communication a feasible possibility.

After reviewing existing discrete cosine transform (DCT) based video technologies, such as MPEG1/2/4 and H.261/263, the inventors discovered that they perform relatively well in a bandwidth range greater than about 40 kbps for quarter common intermediate format (QCIF) size. However, a bandwidth range of only 20-40 kbps is the current range that is stably provided in 2.5G wireless networks. Moreover, the conventional MPEG/H.26x codecs are computationally expensive and practically infeasible for real-time coding on mobile devices in particular.

Unfortunately, in very low bandwidth conditions, the video generated by MPEG/H.26x usually looks like a collection of color blocks. Furthermore, the motion in MPEG/H.26x-coded video tends to become discontinuous.

Accordingly, there is a need for schemes and/or techniques that can enable video to be used in low-bandwidth situations and/or with relatively computational weak hardware.

SUMMARY

Video rate control is enabled with a model-based rate control mechanism involving the percentage of less probable symbols (LPSs). The mechanism is first described in the context of bi-level video, and it is then extended for multi-level video by applying it to individual bit planes thereof. A model parameter represents a relationship between an LPS reduction ratio and a bit-count reduction ratio. The model parameter thusly facilitates transforming a targeted bit-count into an LPS reduction ratio. A given LPS reduction ratio can be attained by adjusting a threshold band half-width wherein LPS pixels within the threshold band are converted to more probable symbols (MPSs). Because encoded MPS pixels consume less bandwidth than LPS pixels, this conversion can reduce the bit rate.

In a described implementation, a threshold band half-width is set so as to achieve a desired LPS reduction ratio. The desired LPS reduction ratio is determined based on a desired bit-count reduction ratio and the model parameter. The desired bit-count reduction ratio is determined using a bit plane complexity value and a targeted bit-count. The targeted bit-count is established responsive to a targeted bit-rate and a targeted frame-rate, as well as buffer-related values.

Other method, system, approach, apparatus, device, media, procedure, arrangement, etc. implementations are described herein.

BRIEF DESCRIPTION OF THE DRAWINGS

The same numbers are used throughout the drawings to reference like and/or corresponding aspects, features, and components.

FIGS. 3A and 3B illustrate example template and context constructions for an I-frame and an inter-frame, respectively.

FIG. 4 illustrates an example template and context construction for computing an image complexity E.

DETAILED DESCRIPTION

Introduction

Figure 1A:
FIGS. 1A and 1B jointly illustrate an example of generating a bi-level image from a gray-scale image using a relatively simple thresholding method.

As noted above, in very low bandwidth conditions, the video generated by MPEG/H.26x usually looks like a collection of color blocks and the motion becomes discontinuous. However, in video communications, facial expressions that are represented by the motions of the outlines of the face, eyes, eyebrows, and mouth deliver more information than the basic colors of the face. Bi-level video can represent these facial expressions and achieve very high compression ratios.

In low bandwidth conditions, such as below 20 kbps, bi-level video possesses clearer shape, smoother motion, shorter initial latency and much cheaper computational cost than DCT-based schemes. If more bandwidth is available, using portrait video, which is an extension of bi-level video, can take advantage of the extra bandwidth. Portrait video is composed of more gray levels, and it therefore possesses a better visual quality. Portrait video is so named because the coding is ordered from outlines to details, and videos at lower detail levels appear similar to portraits. The bit rate of portrait videos at levels 3-4 fits well into the bandwidth range of 20-40 kbps.

Bi-level video and portrait video are described further in two related U.S. patent applications. A first related patent application is entitled "A SYSTEM AND PROCESS FOR BROADCAST AND COMMUNICATION WITH VERY LOW BIT-RATE BI-LEVEL OR SKETCH VIDEO." This first related patent application was assigned application Ser. No. 09/844,549 and filed on Apr. 28, 2001. A second related patent application is entitled "A SYSTEM AND METHOD FOR SCALABLE PORTRAIT VIDEO." This second related patent application was assigned application Ser. No. 10/302,653 and filed on Nov. 22, 2002. Both application Ser. No. 09/844,549 and application Ser. No. 10/302,653 are hereby incorporated by reference in their entirety herein.

Rate control is typically a significant component of a video coding scheme. In many applications, especially in real-time video communication, video data must be transmitted over limited bit-rate channels. The rate-control scheme is then responsible for adjusting the coding parameters to adapt the bit rate to the given target bit rate. In general DCT-based video coding schemes, coding parameters can be directly calculated by a rate-distortion function. However, in the portrait video coding scheme, the bit rate cannot be modeled by a rate-distortion function as in DCT-based schemes.

As described cursorily below, a semi-empirical rate-control method can be used in portrait video. In this method, some semi-empirical modes are obtained offline by encoding numerous sequences with vastly varying content. Each mode corresponds to a pair of coding parameters. During encoding, an appropriate mode is selected according to the available channel bandwidth and output buffer fullness. However, because the picture complexity of different sequences and different frames in the same sequence may be vastly diverse, the predefined modes cannot effectively control the bit rate; as a result, many frames are skipped.

In short, a problem exists because there is not a rate-distortion function that can model the bit rate for portrait video. Consequently, intrinsic characteristics of this video form lead to a difficult challenge: How can the bit rate be estimated and controlled as accurately as possible? This challenge is exacerbated because the picture complexity is hard to know and the coding parameters are not easily derived.

Described herein is an example method that not only effectively controls the bit rate but also requires relatively little additional computational overhead. First, entropy is used to estimate the picture complexity. Second, the LPS percentage is calculated using an LPS-Rate function. Third, coding parameters are determined according to the LPS percentage. Experimental results indicate that the proposed method not only effectively controls the bit rate, but it also significantly reduces the number of skipped frames. The principles of this mechanism can also be applied to general bit plane coding and/or in other image processing and video compression technologies.

Bi-Level Video Coding and Rate Control

Bi-level video coding is the basis for portrait video coding. In describing an implementation of the rate-control technique, bi-level video coding is first examined. In other words, prior to describing an implementation of the model-based rate control mechanism, the architecture of the generation and coding of bi-level video is first reviewed in this section. The semi-empirical rate-control method is also briefly summarized.

Architecture of Bi-Level Video Coding

In video communications, the facial expression represented by the motions and positions of the outlines of the face, eyes, eyebrows, and mouth delivers more information than the basic colors of the face. Because outline representation may be accomplished with two colors, such as black and white, a video form in which each pixel is represented by a single bit is developed. The inventors dubbed this single-bit-per-pixel video form bi-level video.

Figure 1B:

FIGS. 1A and 1B jointly illustrate an example of generating a bi-level image 104 from a gray-scale image 102 using a relatively simple thresholding method. From both of these images 102 and 104, the person can clearly be identified. Experiments have also shown that it is quite easy to perceive facial expressions of a person in a bi-level image sequence.

Conversion of a color video to a bi-level image sequence (e.g., a bi-level video) achieves a significant bit-rate reduction. For example, a 256 level gray-scale image consumes eight bits per pixel, but a bi-level image consumes one bit per pixel. Nevertheless, further compression can be beneficial. To further compress a bi-level image sequence, a bi-level video coding architecture is employed.

Figure 2:
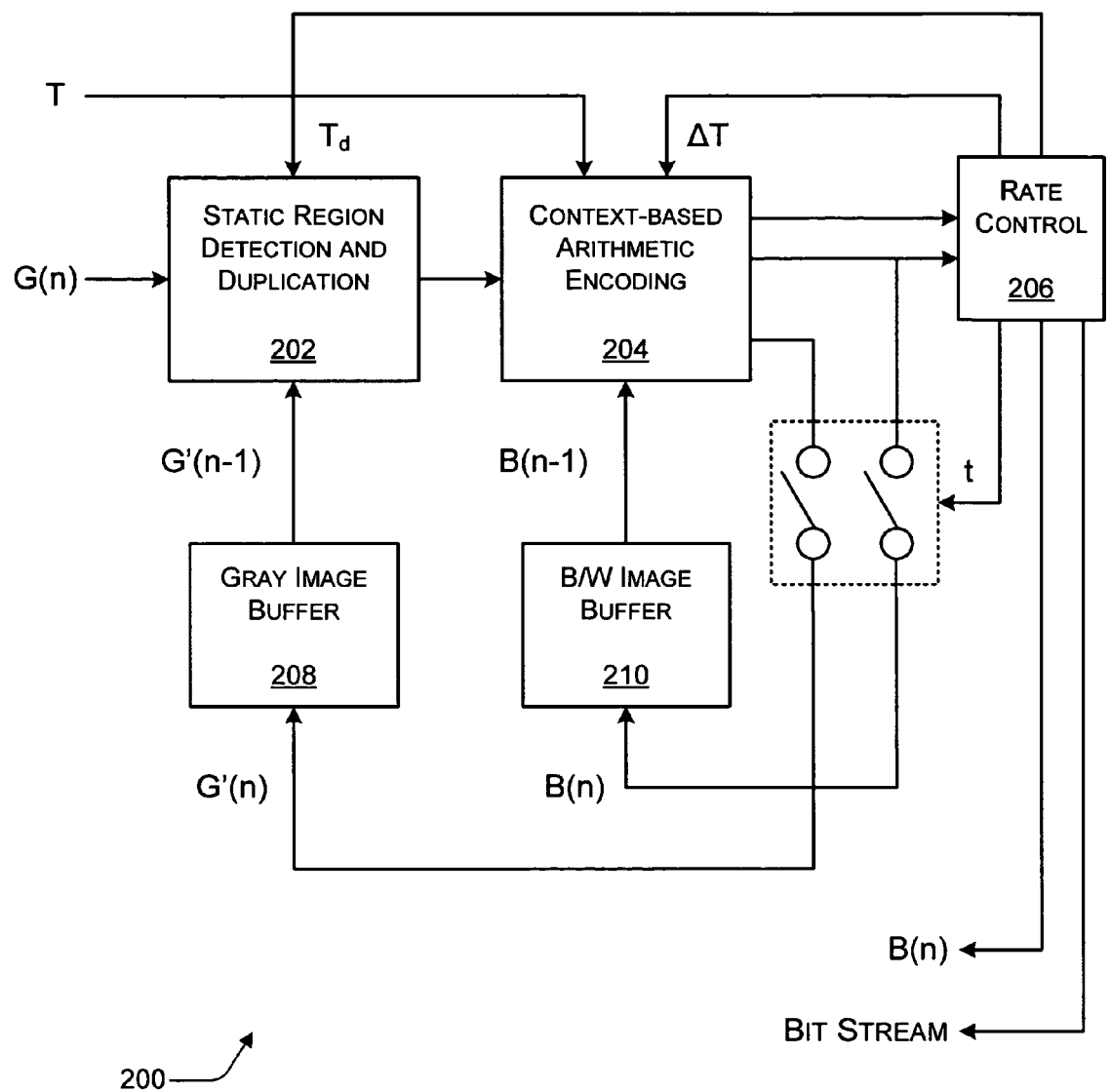
FIG. 2 is a block diagram of an example bi-level video encoder structure with semi-empirical rate control.

FIG. 2 is a block diagram of an example bi-level video encoder structure 200 with semi-empirical rate control. Bi-level video encoder structure 200 includes multiple modules or units 202-210. These modules include a static region detection and duplication unit 202, a context-based arithmetic encoding unit 204, a (semi-empirical) rate control unit 206, a gray image buffer 208, and a black/white (B/W) image buffer 210. Bi-level video encoder structure 200 accepts as input a gray-scale image frame G(n) at static region detection and duplication unit 202 and produces as output a bit stream and a bi-level image B(n) at rate control unit 206.

As shown in FIG. 2, G(n) is an input gray-scale image frame. If this frame is an intra-frame (I-frame), it is directly sent to the adaptive context-based arithmetic encoding (CAE) module 204. Otherwise, the input gray-scale image frame G(n) is compared with its previous frame (i.e., G'(n−1)) in the static region detection and duplication module 202. For image regions that are under a dissimilarity threshold $T_d$, each pixel is duplicated from its corresponding pixel in the previous frame.

In CAE module 204, each pixel is coded in a raster order. The process of encoding a given pixel involves three parts. First, a context number is computed. If the frame is an I-frame, a 10-bit context $$C = \sum_k c_k \cdot 2^k v$$

is computed based on the coded pixels in the current frame, as illustrated in FIG. 3A. Otherwise, a 9-bit context number is built from the current frame with respect to the previous bi-level image frame B(n−1), as illustrated in FIG. 3B.

FIGS. 3A and 3B illustrate example template and context constructions 300 and 350 for an I-frame and an inter-frame, respectively. Context 300 for I-frames includes 10 bits. Context 350 for inter-frames includes nine bits. Each of contexts 300 and 350 indicate a relevant pixel of interest (e.g., the pixel to be coded) with a question mark "?". With context 350, pixels of the current frame and pixels of the previous frame are also identified. As indicated, there is an alignment between the pixel of interest in the current image frame, and pixel "C6" in the previous image frame.

In a second part, the bi-level value for the pixel of interest in terms of a threshold T and $\Delta T$ is determined. For a pixel with its gray-scale value within the threshold band [T–$\Delta T$, T+$\Delta T$], its bi-level value is determined according to the probability table indexed by the context number. If the probability of a "0" value is larger than the probability of a "1" value for the pixel, the bi-level value is set to 0. If the probability of a "1" value is larger than the probability of a "0" value for the pixel, the bi-level value is set to 1.

In a third part, the indexed probability value is used to drive an arithmetic coder. After the entire frame is processed, the compressed bits and the bi-level image are sent to rate control module 206. Rate control module 206 adjusts the dissimilarity threshold $T_d$ and the half-width of the threshold band $\Delta T$, and it outputs a flag t to indicate if the image frame is transmitted.

Semi-Empirical Rate Control

In a DCT-based coding scheme, bit-rate control is achieved by adjusting the quantization parameter. In a bi-level video coding scheme, the bit rate can be adjusted by either or both of the following two approaches:

(1) Threshold Band $\Delta T$: The wider that the threshold band is, the more pixels that are coded according to the probability table of the adaptive context-based arithmetic coder 204. Consequently, fewer bits are generated when the threshold band is increased/widened.

(2) Dissimilarity Threshold $T_d$: The higher that the dissimilarity threshold is, the more pixels that are viewed as being similar to their corresponding pixels in the previous frame. Consequently, a higher compression ratio is achieved as the dissimilarity threshold is increased/raised.

Thus, the goal of rate control in the bi-level video scheme is to adapt the bit rate to the target rate by adjusting the width of the threshold band and the value of the dissimilarity threshold.

A difficulty is that, unlike with DCT-based coding, bi-level video coding does not have a rate-distortion function that can be modeled by a simple analytic function. Therefore, a semi-empirical method is described here. In this method, a number of (e.g., 10) semi-empirical modes is obtained offline by encoding numerous sequences with vastly varying content. Each mode corresponds to a combination of the half-width of the threshold band ($\Delta T$) and the dissimilarity threshold ($T_d$).

During video coding, after a frame is encoded, an appropriate mode from among the number of semi-empirical modes is selected for the next frame according to the target bit rate and output buffer fullness. However, because the picture complexity of different sequences and of different frames in the same sequence may be vastly diverse, applying the same mode to different images is likely to achieve vastly different performance results. The semi-empirical method therefore fails to control the bit rate to a desired level of effectiveness.

Thus, a rate control problem with bi-level video is due, at least partially, to the unavailability of a rate-distortion function that can model the bit rate. In the following section, another kind of model that accurately estimates and controls the bit rate is introduced and described.

Model-Based Rate Control for Bi-Level Video

The general rate-control algorithm of DCT-based video coding schemes is derived from classic rate-distortion (R-D) theory, whereas an implementation of the described rate-control model is based on the principle of entropy coding. This section initially introduces and explains how the compression ratio can be improved using entropy coding. It then elaborates how the rate-control model is built based on the principle of entropy coding.

How the Compression Ratio is Improved

Given a source S that generates random symbols, $s_1, s_2, \ldots, s_N$, and the probability $p_i$ of the occurrence of symbol $s_i$, according to Shannon's information theory, the average information, say entropy, of the source is defined as $$H(S) = \sum_i p_i \log_2 \frac{1}{p_i}. \quad (1.)$$

From information theory, if the symbols are distinct, then the average number of bits needed to encode them is bounded by their entropy.

Binary arithmetic coding is one of the coding methods that can approach the entropy bound. There are two kinds of input symbols in a binary arithmetic coder. The symbols that occur with high probability are usually referred to as the more probable symbol (MPS), and the symbols that occur with lower probability are referred to as the less probable symbol (LPS). With binary arithmetic coding, the probability interval is recursively subdivided.

Assume that the LPS occurs with a probability of $Q_e$. The probability of MPS is therefore $(1-Q_e)$. The subinterval for LPS is ordered above the subinterval for MPS. If the width of the probability interval is represented by A and the code register is defined as C, an example coding process is defined by:

For MPS coding, $$C=C \quad (2.)$$

$$A=A(1-Q_e). \quad (3.)$$

For LPS coding, $$C = C + A(1 - Q_e) \quad (4.)$$

$$A = AQ_e. \quad (5.)$$

From the coding process above, it is apparent that whenever the MPS is coded, the code register C is left unchanged. On the other hand, whenever the LPS is coded, the value of $A(1-Q_e)$ is added to the code register C. Thus, the smaller or lower the number of LPS is, the higher the compression ratio is. Hence, lowering the number of LPS can increase the compression ratio and concomitantly decrease the bit rate.

The two approaches described above (i.e., the threshold band $\Delta T$ and the dissimilarity threshold $T_d$) with respect to bi-level video coding can be used to improve the compression ratio in manners that actually comply with the above conclusion. First, for a pixel being originally regarded as LPS according to the single threshold T, if its gray-scale value is within the threshold band [T–$\Delta T$, T+$\Delta T$], it is converted to MPS. Thus, enlarging the threshold band reduces the number of LPS's. Second, the higher that the value of the dissimilarity threshold is, the more pixels that are duplicated from the previous frame; therefore, fewer LPS's occur as the dissimilarity threshold rises.

The observations above indicate that a model between the number of LPS's and the compression ratio (or bit-rate reduction) may be developed. Development of such a model is described below.

Bit-Rate Estimation

As noted above, one difficulty in achieving rate-control in this environment is that the picture complexity is not known prior to encoding. In contradistinction for DCT-based schemes, the picture complexity is generally represented by the mean absolute difference (MAD) of the current frame after motion compensation. However, with bi-level video, there is no motion estimation and compensation module. A possible approach is to use the amount of information as the picture complexity. As entropy is the average information of a source, the picture complexity is computable before encoding. Moreover, because entropy is the lower bound of lossless compression and is measured in bits per symbol, the picture complexity here is also an estimate of the encoding bit count.

In adaptive context-based arithmetic encoding, the entropy cannot be simply obtained by using equation (1) with the occurrence probabilities of symbol 0 and symbol 1. To compute the complexity of a picture, pixels are classified into N groups according to their corresponding context values. N is equal to the number of the contexts. For example, for a template containing 9 bits, $N=2^9$.

Each group here actually acts as a source. The entropy of each group is calculated respectively, and then the complexity of the picture can be obtained as follows:

$$H(i) = p_{i0} \log p_{i0}^{-1} + p_{i1} \log p_{i1}^{-1} \quad (6.)$$

$$E = \sum_{i=1}^{N} H(i) N_i \quad (7.)$$

where $p_{i0}$ and $p_{i1}$ represent the probability of symbol 0 and 1 respectively in the $i^{th}$ group, $N_i$ is the number of symbols belonging to the $i^{th}$ group, and E is the picture complexity, namely the estimate of the encoding bit count. It should be noted that to achieve a more accurate estimate, the source in complexity computation and encoding is preferably the same; therefore, picture complexity determination is better carried out after detection and duplication of static regions.

Because the number of bits needed to encode a source is bounded by its entropy, if the same context template is used when computing E and when encoding, E should be smaller than the actual encoding bit count. On the other hand, computing the context values is relatively computationally expensive. If the same template is adopted in practice, the cost of computing E is almost comparable to that of encoding a bi-level image. Therefore, a context template that has fewer context bits can be used for computing E, as is described below.

FIG. 4 illustrates an example template and context construction 400 for computing an image complexity E. Context 400 includes six bits. A relevant pixel that is currently of interest (e.g., the pixel to be coded) is indicated with a question mark "?". With context 400, pixels of the current frame and pixels of the previous frame are also identified. As indicated, there is an alignment between the pixel of interest in the current image frame, and pixel "C5" in the previous image frame.

Analogously to other rate-control methods, inter-frame coding (but not intra-frame) is considered in portrait video rate control. As compared to the inter template 350 (of FIG. 3B), the context bits C7 and C8, which are likely the same as C0 and C2, are removed. The context bit C1 is also removed to further reduce the number of context bits. The result is the six-bit template 400 as shown in FIG. 4. This smaller template in used when computing E. From experiments on many sequences, template 400 can relatively accurately estimate the actual encoding bit count. Example graphs indicating as much are shown in FIG. 5, which is described below. Additionally, template 400 significantly reduces the computational cost because N=64.

Figure 5A:
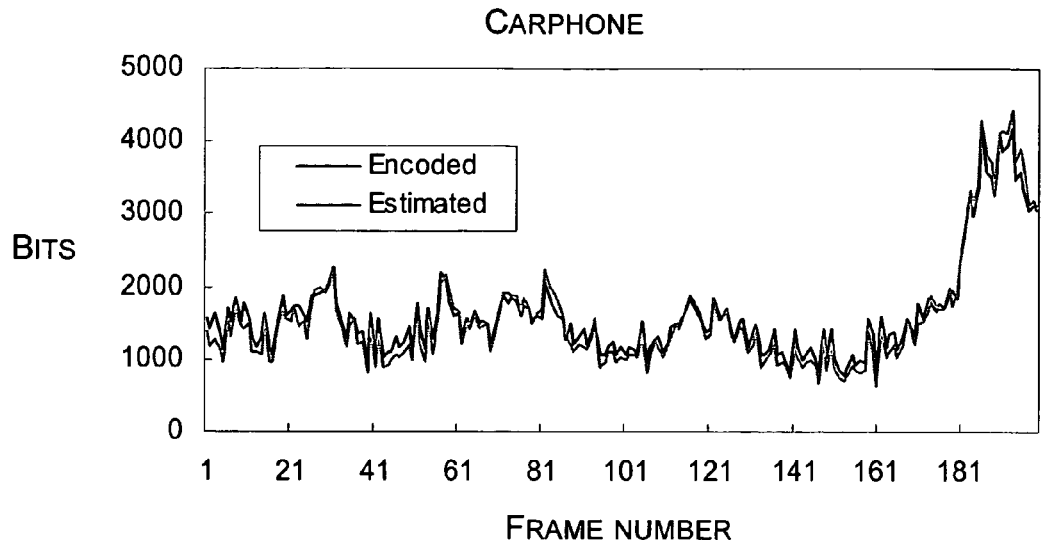
FIGS. 5A and 5B are graphs of example bit-rate estimations and corresponding encodings.
Figure 5B:
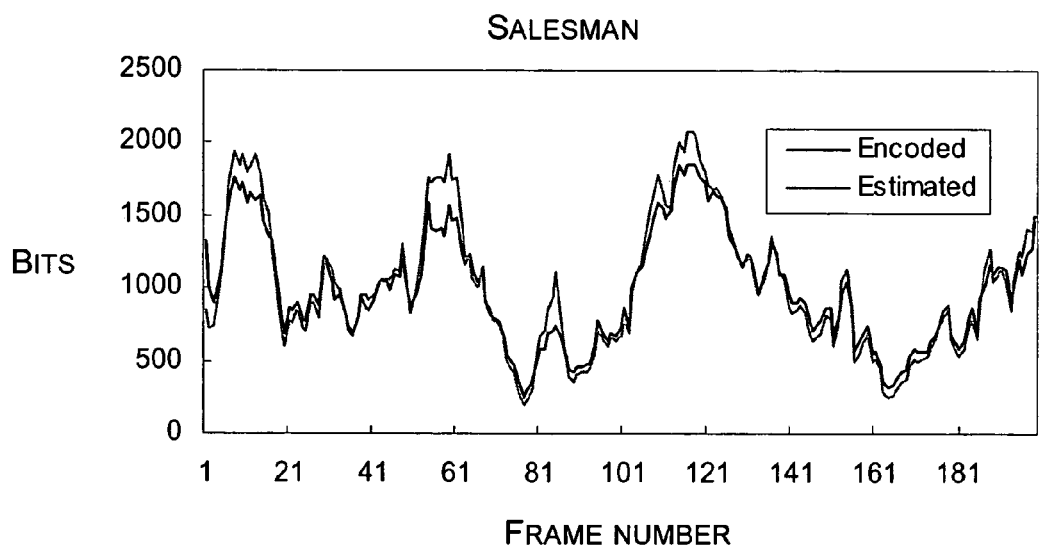

FIGS. 5A and 5B are graphs 500A and 500B of example bit-rate estimations and corresponding encodings. Graph 500A is for a carphone video sample, and graph 500B is for a salesman video sample. Each graph plots frame number versus bits for a complexity estimation and a corresponding encoding. The estimated bits (plotted with the lighter line) are generally close to and usually greater than the actual corresponding encoded bits (plotted with the darker line).

As noted in the preceding subsection, the number of LPS's can significantly impact bit-rate reduction. The number of LPS's can be relatively easily obtained while computing the picture complexity E. For example, given a pixel that is classified to the $i^{th}$ group, if its gray-scale value is not larger than the threshold T but $p_{i0} < p_{i1}$, or its gray-scale value is larger than T but $p_{i0} > p_{i1}$, this pixel is regarded as an LPS. At the same time, the number of LPS pixels within a threshold band of different widths is also countable. For an example algorithm: $LPS_{all}$ is defined to be the total number of LPS pixels in the whole picture, and $LPS_i$ is defined to be the number of LPS pixels which have gray-scale values within the threshold band [T−i, T+i]. If the half-width of the threshold band is set to be i during encoding, the LPS's within the band are converted to MPS. The LPS reduction ratio $LPS_{ri}$ becomes $$LPS_{ri} = \frac{LPS_i}{LPS_{all}}. \quad (8.)$$

Available Width of the Control Range

As explained above, adjusting the width of the threshold band and changing the value of the dissimilarity threshold can control the bit rate. In the semi-empirical rate-control method described above, the range of $T_d$ and $\Delta T$ is [1.0, 3.0] and [0, 5], respectively. In practice, for large motion scenes (such as the Carphone sequence) small regions are regarded as static and duplicated from the previous frame. In small motion scenes (such as the Akiyo sequence), although increasing $T_d$ can reduce the bit rate, it also introduces a significant loss or decrease in visual quality. Moreover, a relationship between the dissimilarity threshold $T_d$ and the LPS reduction ratio cannot be formulated as clearly as that for $\Delta T$.

Figure 6:
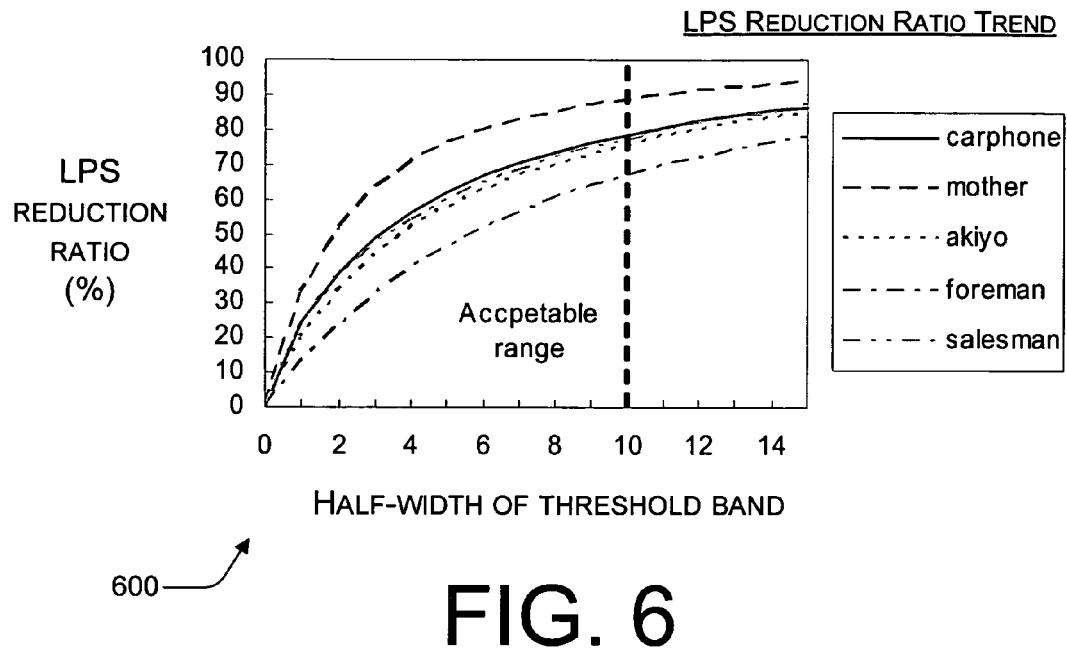
FIG. 6 is a graph showing an example LPS reduction ratio trend.

Consequently, in a described implementation, the dissimilarity threshold $T_d$ is fixed. More specifically, the dissimilarity threshold $T_d$ is fixed to a value that does not appear to introduce a visible loss in the visual quality of the video. By way of example only, a value of 0.8 for the dissimilarity threshold $T_d$ seems to work adequately if not well on various sequences. In alternative implementations, the value of the dissimilarity threshold $T_d$ may be set to other values or may also be varied during operation FIG. 6 is a graph 600 showing an example LPS reduction ratio trend. Graph 600 plots the half-width of the threshold band $\Delta T$ versus the LPS reduction ratio. The graphed range of the half-width of the threshold band is from 0 to 14, and the graphed range of the LPS reduction ratio is from zero to 100%. Experimentation and visual appraisal indicates that enlarging the threshold band can effectively reduce the number of LPS's with little if not virtually no obvious loss in visual quality.

As shown in FIG. 6, however, the rise of the LPS reduction ratio slows down (e.g., somewhat asymptotically) even as the threshold band continues to widen. When the half-width of the threshold band $\Delta T=10$, the degradation of visual quality is acceptable while the number of LPS's is also significantly reduced. Therefore, by way of example only, the range of the threshold band is enlarged by plus or minus 10, which is $[T-10, T+10]$. In alternative implementations, the value of the half-width of the threshold band $\Delta T$ may be more or less than 10.

Bit-Rate Reduction Model

From the foregoing description, it is apparent that reducing the number of LPS's decreases the encoding bit count. This can be verified using the LPS reduction ratio calculated with equation (8). This verification is illustrated in FIG. 7.

Figure 7:
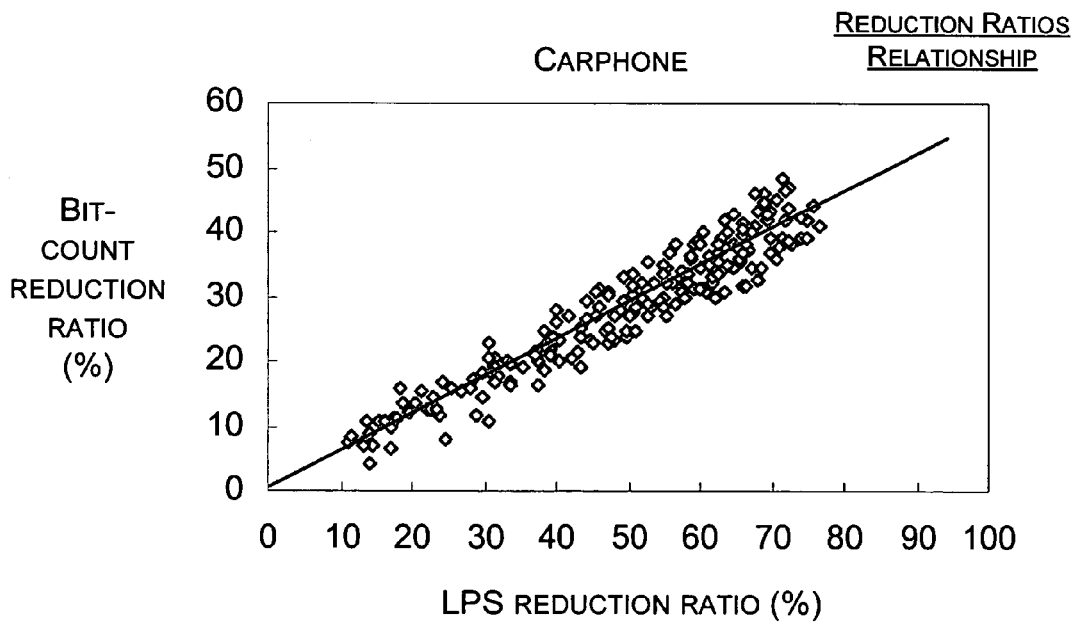
FIG. 7 is graph that illustrates an example reduction ratios relationship between a bit-count reduction ratio and an LPS reduction ratio.

FIG. 7 is graph 700 that illustrates an example reduction ratios relationship between a bit-count reduction ratio and an LPS reduction ratio. Graph 700 has two hundred points and plots the LPS reduction ratio versus the bit-count reduction ratio. The plotted range of the LPS reduction ratio is 0-100%, and the plotted range of the bit-count reduction ratio is 0-60%. As illustrated, graph 700 is a scatter plot with the two hundred points being obtained by encoding the first 20 frames of the Carphone sequence with the half-width of the threshold band $\Delta T$ varying from 1 to 10.

FIG. 7 not only shows that the bit-count reduction ratio increases along with the LPS reduction ratio, but it also indicates that they essentially adhere to a relationship that is at least roughly linear. If the linear relationship is relatively stable, uniform, and accurate with different picture contents and with different widths of the threshold band, then such a linear relationship can be used as a model. Thus, the following model is defined:

$$\frac{LPS_{ri}}{Rate_{ri}} = P_i, \text{ for } i = 1, \cdots, 10 \quad (9.)$$

where $LPS_{ri}$ represents the LPS reduction ratio, and $Rate_{ri}$ represents the bit-count reduction ratio when the half-width threshold band $\Delta T=i$, and $P_i$ is the model parameter. After defining the model, it is examined on many sequences with vastly varying content.

Figures 8A, 8B:
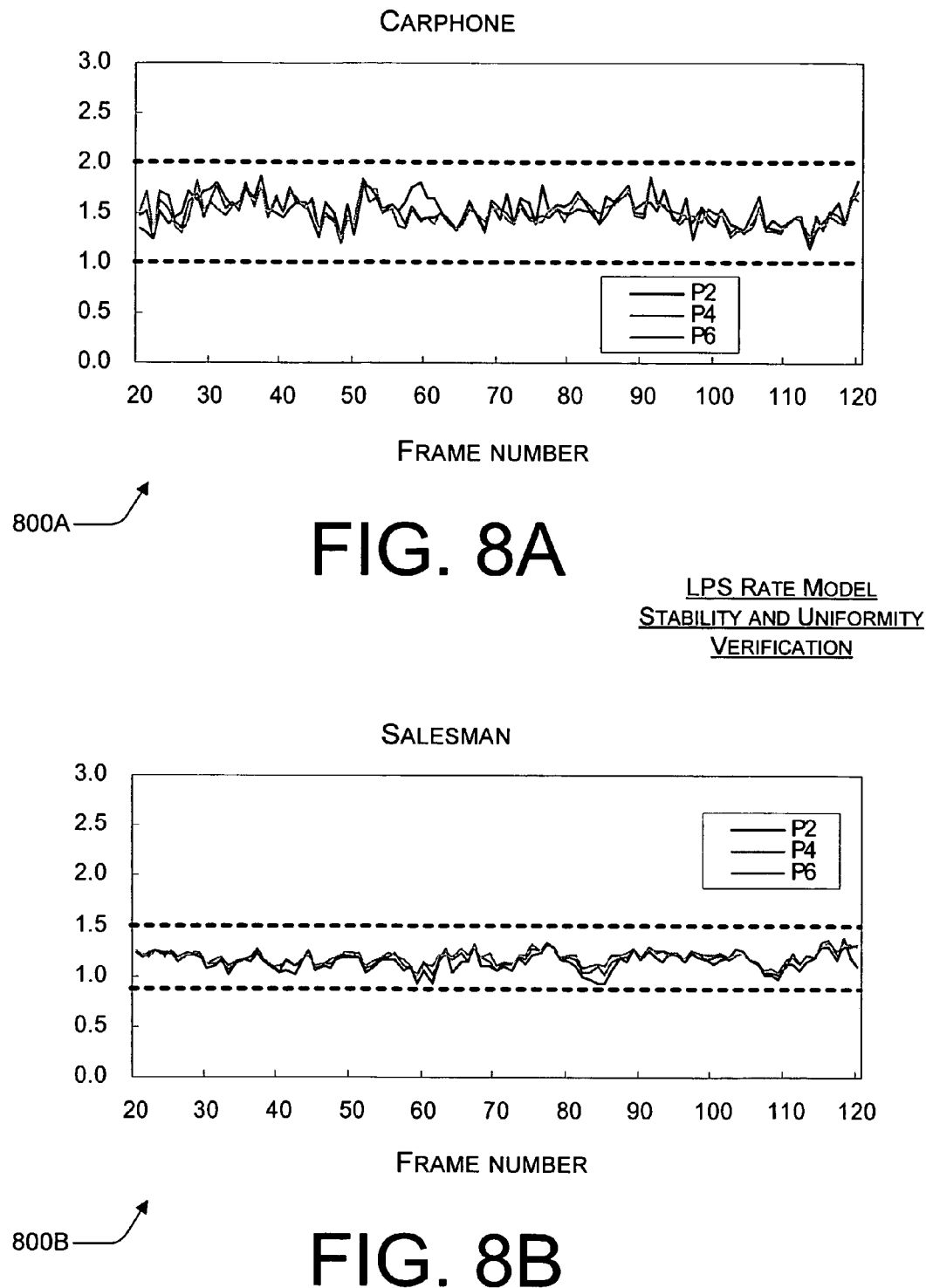
FIGS. 8A and 8B are example graphs for verifying the stability and uniformity of the example LPS rate model.

FIGS. 8A and 8B are example graphs 800A and 800B for verifying the stability and uniformity of the example LPS rate model. Graphs 800A and 800B graph frame number versus model parameter for multiple values of the half-width of the threshold band $\Delta T$. The examination results of the Carphone sequence of graph 800A and the Salesman sequence of graph 800B each have three curves. Specifically, the three curves represent the models with $\Delta T$ equal to 2, 4, and 6, respectively.

In the Carphone graph 800A of FIG. 8A, all three curves are between 1.5 and 2. The three curves slightly fluctuate around the line of 1.2 in the Salesman graph 800B of FIG. 8B. It is thus verified that the model is at least relatively stable. This characteristic also matches the results (not shown) of other test sequences. Moreover, the three curves substantially coincide in both graphs. It is also verified (i) that the model is relatively uniform with different $\Delta T$ and (ii) that a uniform P can be used to replace $P_i$.

To further examine whether the model is accurate, one approach is to use it to estimate the encoding bit count with different half-width of the threshold bands $\Delta T$. As described above (e.g., with reference to FIGS. 5A and 5B), the picture complexity E is an accurate estimate of the encoding bit count when $\Delta T$ is zero. After some manipulation of equation (9) above, the bit-count reduction ratio $Rate_{ri}$ can be obtained by using equation (10) below. From the bit-count reduction ratio $Rate_{ri}$, the estimated bit-count $L_e$ for $\Delta T=i$ can be calculated from equation (11) as follows:

$$Rate_{ri} = LPS_{ri}/P \quad (10.)$$

$$L_e = E \times (1-Rate_{ri}) \quad (11.)$$

In a described implementation, the model parameter P is initialized to 1.5 because that is the average value derived from multiple experiments on many sequences. Alternatively, another value for the model parameter P can be used at e.g. initialization.

In a described implementation, after encoding a current frame, the model is updated based on the encoding results of the current frame as well as the results of previous frames. First, given the encoding bit count of the current frame $L_a$, the actual bit-count reduction ratio, say $Rate_r'$, is calculated from equation (12) below. Second, the model parameter is updated by calculating a new model parameter P' in equation (13) below. Third, the new model parameter P' is restricted in a specified range using equation (14), and the restricted new model parameter P' is then smoothed by a low-pass filter to avoid oscillation as shown by equation (15). These equations (12)-(15) for the model update process are presented as follows:

$$Rate_r' = \frac{E - L_a}{E} \quad (12.)$$

$$P' = \frac{LPS_{ri}}{Rate_r'} \quad (13.)$$

$$P' = \max(1, \min(5, P')) \quad (14.)$$

$$P = \alpha P + (1 - \alpha)P' \quad (15.)$$

For the relatively infrequent case in which the calculated complexity E is smaller than the encoding bit count of the current frame $L_a$, i.e. so that $Rate_r' < 0$, the model update process is skipped. Generally, for the filter of equation (15), increasing $\alpha$ increases the influence of the previous model parameter value P whereas decreasing $\alpha$ results in a higher influence of the new value model parameter value P'. Because $\alpha 0.7$ appeared to work at least satisfactorily if not actually well, the following described experiments were carried out with this value for $\alpha$.

Figure 9A:
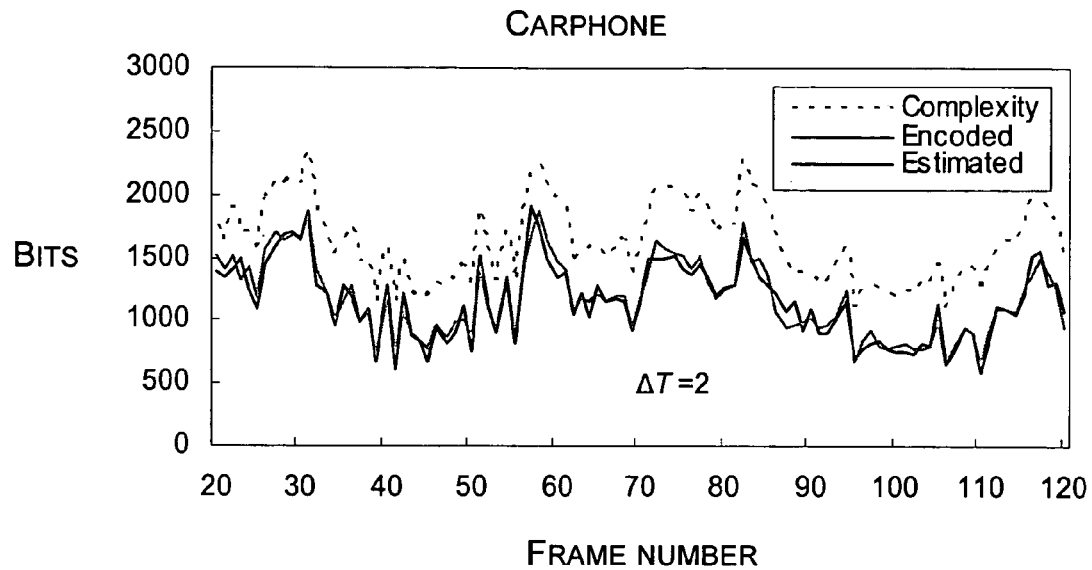
FIGS. 9A and 9B are example graphs of estimated and encoded bit counts for differing widths of the threshold band.
Figure 9B:
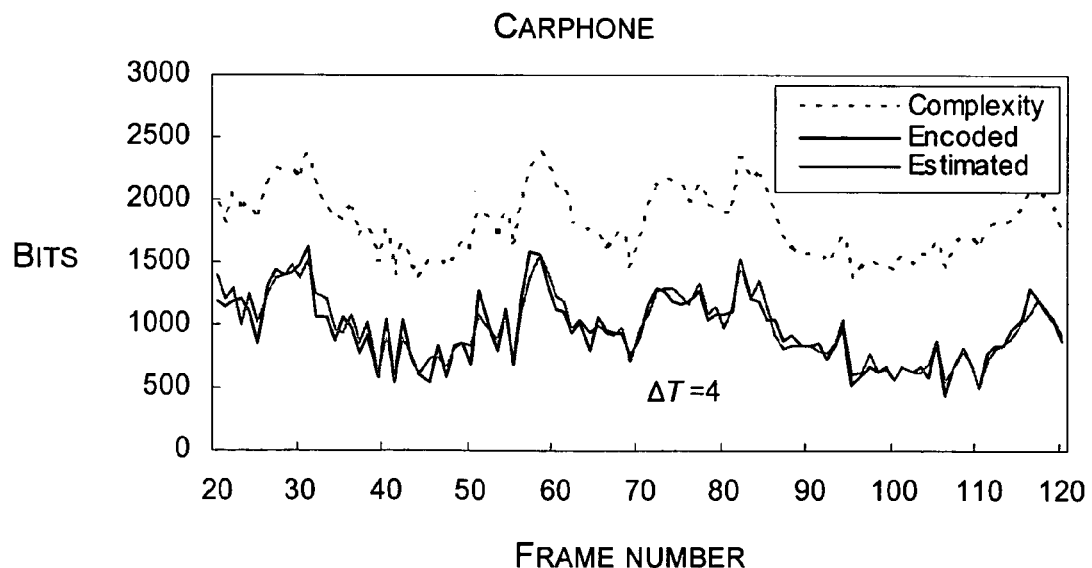

FIGS. 9A and 9B are example graphs 900A and 900B of estimated and encoded bit counts for differing widths of the threshold band. The calculated complexity is also illustrated (as a dashed line). Each graph is for the Carphone sequence and plots frame number versus bit counts. The range of frame numbers as plotted is approximately 20 to 120, and the range of bits as plotted is 0 to 3000. As shown, FIGS. 9A and 9B illustrate how the encoding bit count is accurately estimated using the model. The half-width of the threshold band $\Delta T$ is set to be 2 and 4 in graphs 900A and 900B, respectively.

Comparing FIG. 9A to FIG. 9B also reveals that increasing the width of the threshold band effectively reduces the bit-rate.

Hence, it has been verified that the LPS-rate model is relatively stable, uniform, and accurate under different conditions. In the following section, applying the LPS-rate model to rate control is described.

Model-Based Rate Control

A goal of rate control in a bi-level video scheme is to select an appropriate half-width of the threshold band and dissimilarity threshold that can adapt the bit rate to the target bit rate. Based on the observations and verifications in the previous subsection, a model-based rate-control method is described.

Figure 10A:
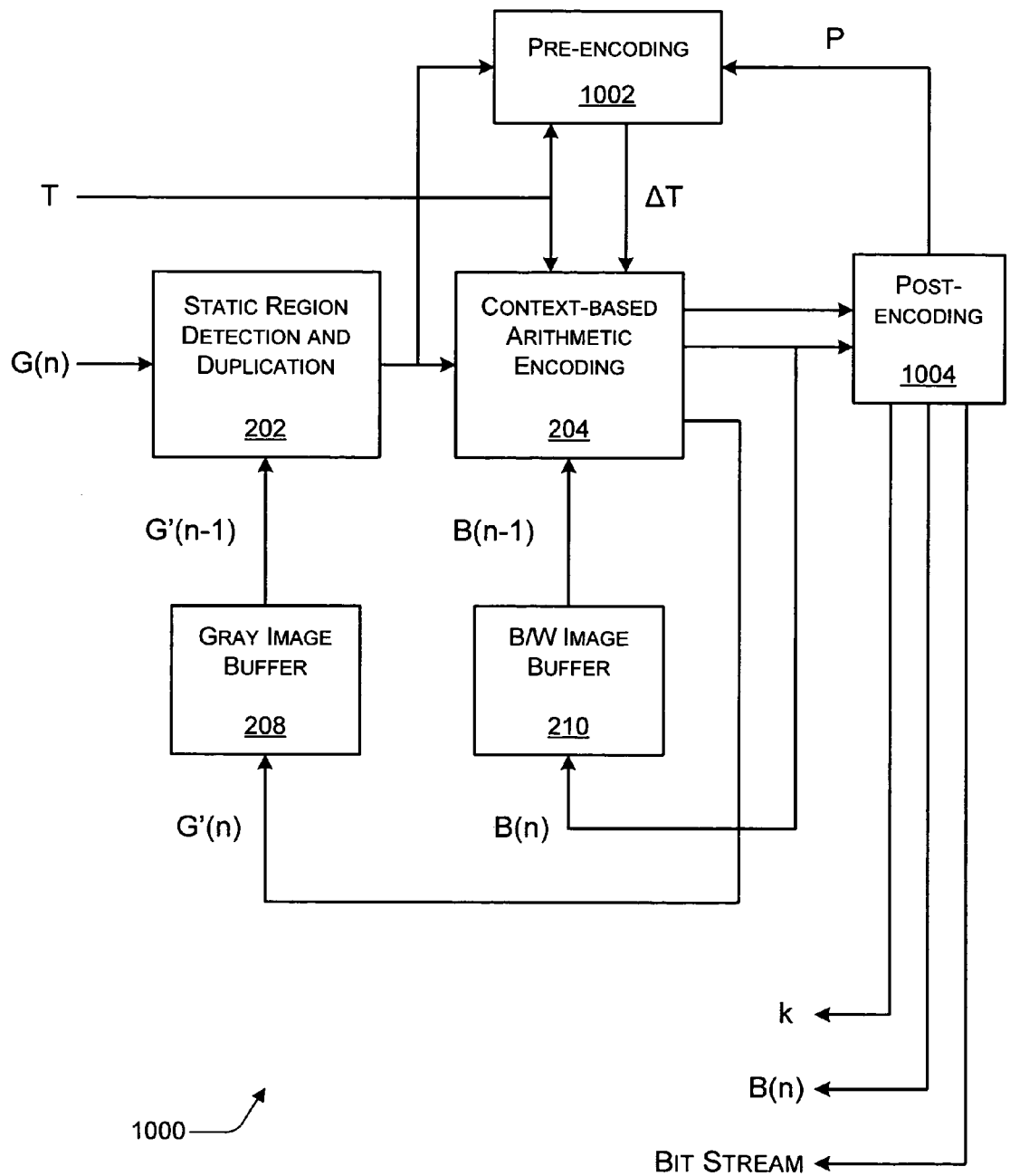
FIGS. 10A and 10B illustrate an example of a video encoder for bi-level video that may implement a model-based rate controller.
Figure 10B:
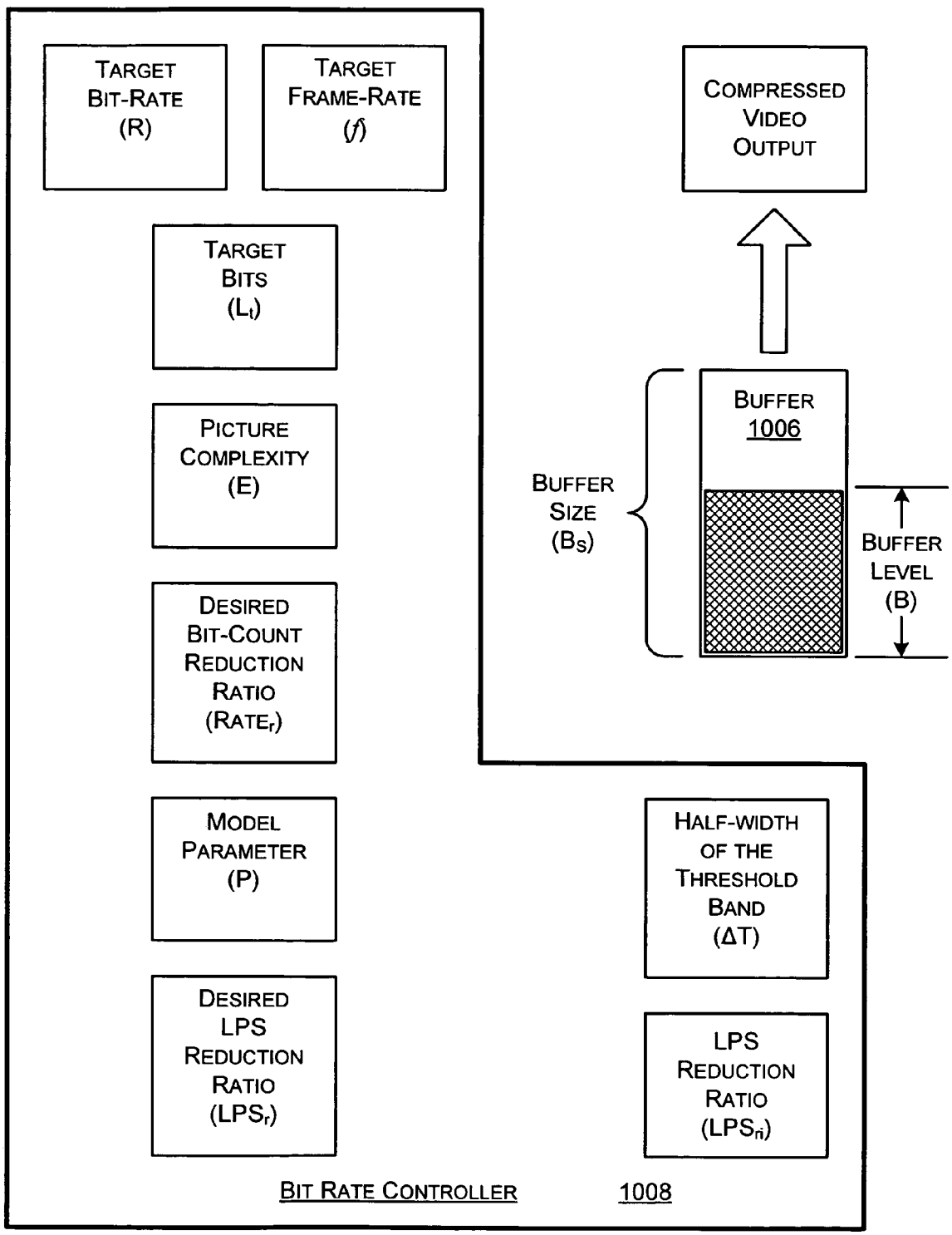

FIGS. 10A and 10B illustrate an example of a video encoder 1000 for bi-level video that may implement a model-based rate controller. In FIG. 10A, a bi-level video encoder structure is shown with a model-based rate-control mechanism module that differs from the structure of FIG. 2. In the new structure 1000, the rate-control module is comprised of two sub-units or sub-modules 1002 and 1004 that are performed before and after the encoding respectively.

Specifically, a pre-encoding module 1002 receives as input the model parameter P and produces as output the half-width of the threshold band ΔT. Additionally, a post-encoding module 1004 produces the output video bitstream and updates the model parameter P.

Concepts, parameters, and their corresponding variables are shown in the video encoder 1000 of FIG. 10B. Video encoder 1000 includes a buffer 1006 having a buffer size $B_S$. During operation, buffer 1006 is also associated with a buffer (fill) level B. This buffer level B of buffer 1006 varies as bits are applied thereto and as bits are extracted therefrom as the compressed video output.

Bit rate controller 1008 utilizes, references, and/or creates multiple variables. These variables are introduced here with reference to FIG. 10B and explained further herein below with reference to FIG. 11A. In a described implementation, these variables include: a target bit-rate R, a target frame-rate f, a number of target bits (or targeted bit-count) $L_t$, a picture complexity E, a desired bit-count reduction ratio $Rate_r$, a model parameter P, a desired LPS reduction ratio $LPS_r$, a half-width of the threshold band ΔT, and an LPS reduction ratio $LPS_{ri}$.

Figure 11A:
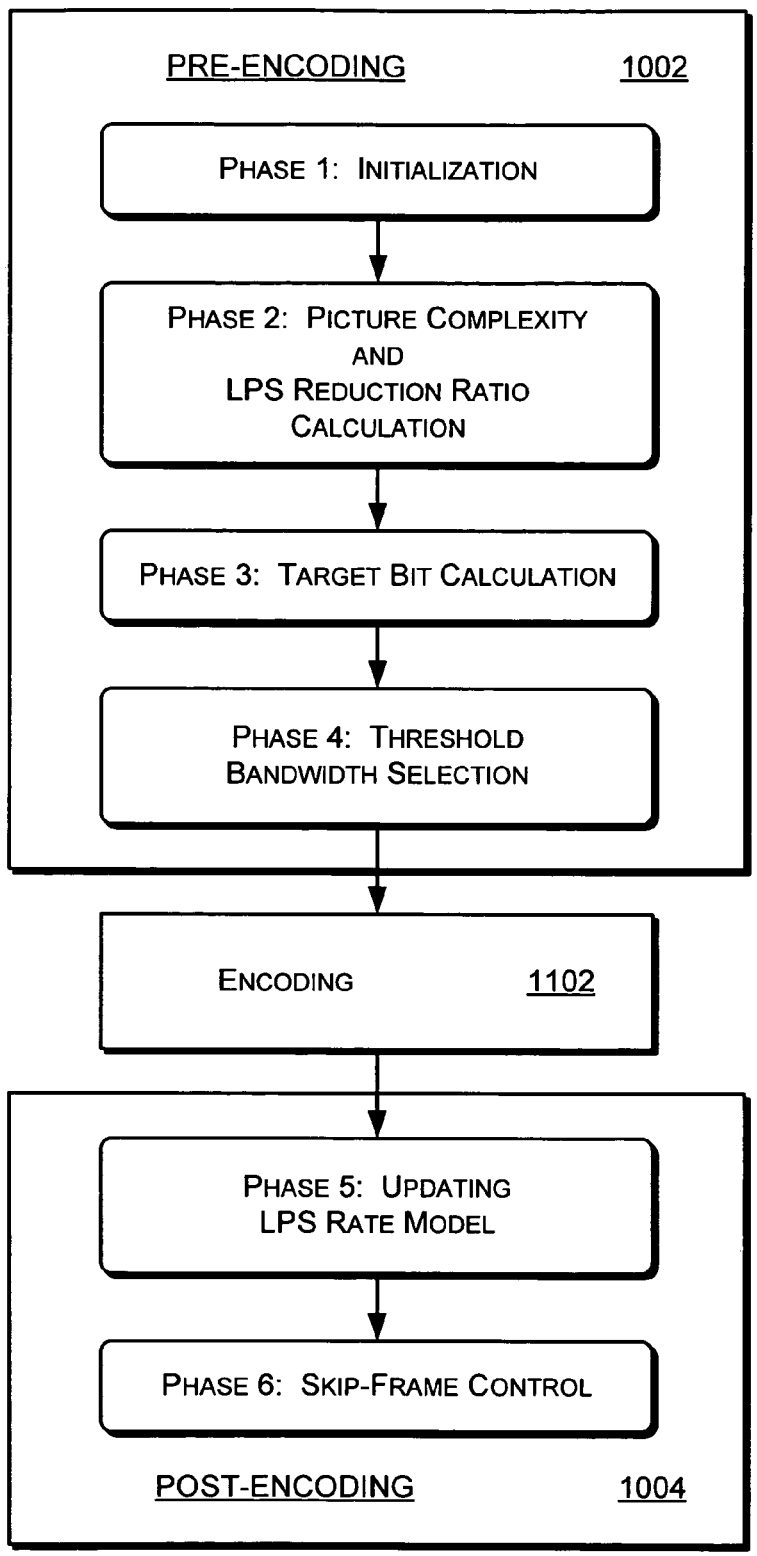
FIG. 11A is flow diagram that illustrates an example of a model-based bi-level video rate-control scheme.

FIG. 11A is flow diagram 1100A that illustrates an example of a model-based bi-level video rate-control scheme. In a described implementation, the rate-control process includes three stages: a pre-encoding stage 1002, an encoding stage 1102, and a post-encoding stage 1004. As illustrated, there are six major phases in the scheme. These phases are discussed further below. The target bit calculation, buffer control, and skip-frame control parts of the scheme are based on that of an MPEG-4 Q2 rate-control scheme. The six phases are:

1) Initialization: At this phase, the model parameter P is initialized to 1.5. The buffer size $B_s$ is initialized to half of the target bit-rate, say ½R, and the buffer level B is initialized to half of the buffer size.

2) Picture complexity and LPS reduction ratio calculation: The picture complexity E can be obtained using equations (6) and (7) above. The LPS reduction ratio $LPS_{ri}$ with ΔT varying from 1 to 10 can be calculated using equation (8).

3) Target bit calculation: The target bits $L_t$ for e.g. each new P-frame are determined as follows:

$$L_t = \frac{R}{f} \times \frac{2B_s - B}{B_s + B} \quad (16.)$$

where f is the target frame rate.

4) Threshold band width selection: First, the desired bit-count reduction ratio $Rate_r$ is calculated from equation (17) below. Second, the desired LPS reduction ratio $LPS_r$ is obtained from equation (18) below. Then, the minimal half-width of the threshold band ΔT that has the LPS reduction ratio $LPS_{ri}$ not smaller than the desired LPS reduction ratio $LPS_r$ is selected as indicated by equation (19) below.

$$Rate_r = \frac{E - L_t}{E} \quad (17.)$$

$$LPS_r = Rate_r \times P \quad (18.)$$

$$\Delta T = \min\{i | i \in \{1, \cdots, 10\}, LPS_{ri} \geq LPS_r\} \quad (19.)$$

If there is no ΔT that satisfies the stipulation of equation (19), then the maximal value is adopted. In this example, the maximum value is 10. In this manner, the desired bit-count reduction ratio $Rate_r$ reflects the targeted bit-count $L_t$. The desired LPS reduction ratio $LPS_r$ reflects the desired bit-count reduction ratio $Rate_r$, and the selected threshold band half-width ΔT reflects the desired LPS reduction ratio $LPS_r$. Hence, the selected threshold band half-width ΔT conversely reflects the targeted bit-count $L_t$.

5) Updating LPS-Rate model: The model parameter P of the LPS-rate function is updated using equations (12)-(15) above.

6) Skip-frame control: After encoding a frame, the buffer level B is updated as indicated by equation (20) below by adding the total number of the bits generated from the current frame $L_a$ and subtracting the number of bits removed from buffer 1006. If the buffer level B exceeds 80% of buffer size $B_S$, video encoder 1000 skips the upcoming k frames, until the occupancy of buffer 1006 is reduced to a safe level.

$$B = B + L_a - \frac{R}{f} \quad (20.)$$

Figure 11B:
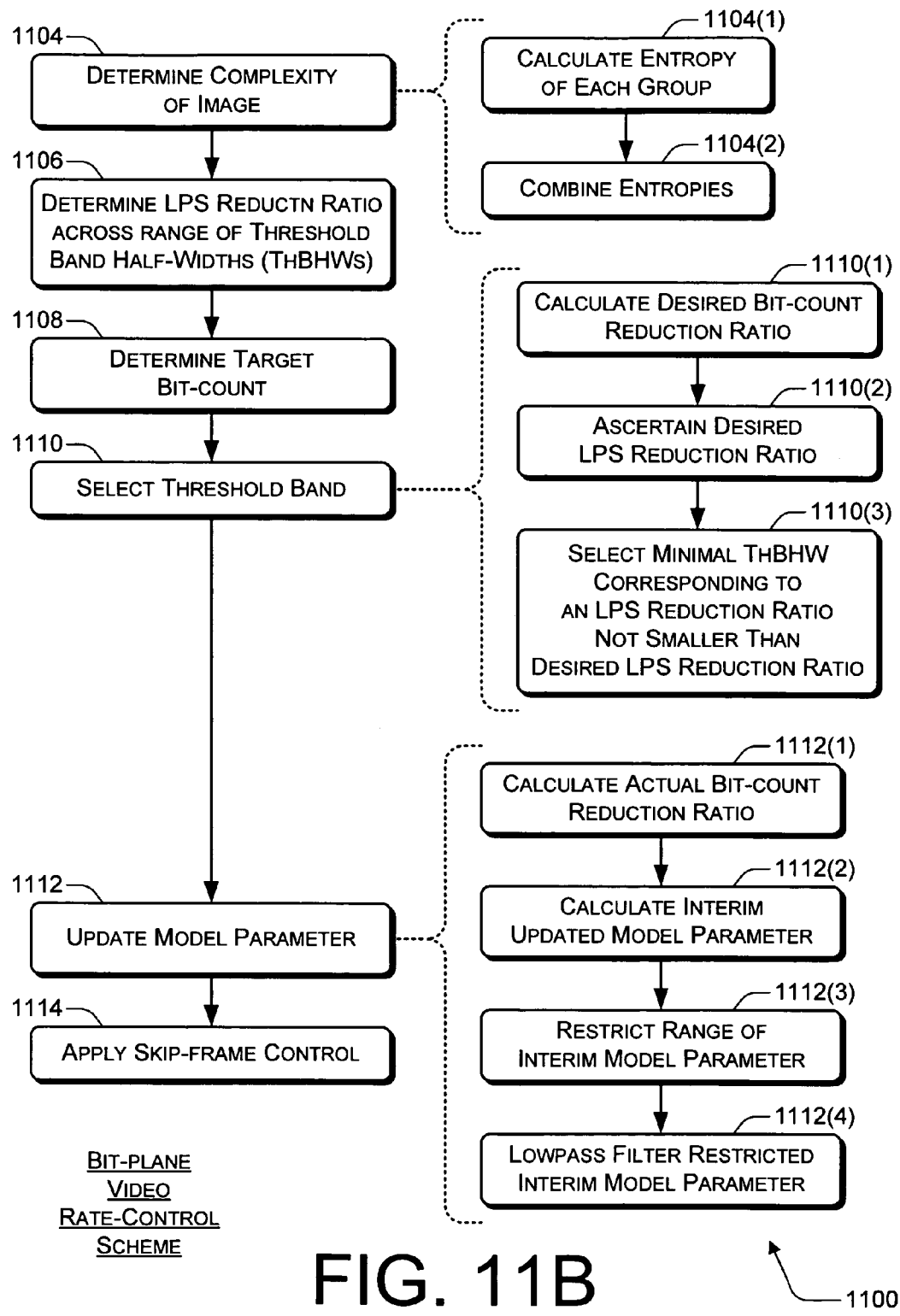
FIG. 11B is flow diagram that illustrates an example of a model-based bit-plane video rate-control scheme.

FIG. 11B is flow diagram 1100B that illustrates an example of a model-based video rate-control scheme that can be applied to bit-planes generally. Flow diagram 1100B includes six "major" actions 1104-1114 and nine "minor" or sub-actions 1104(1-2), 1110(1-3), and 1112(1-4). In a described implementation, the actions are repeated for each image frame of a video. Actions 1104-1106 correspond to phase 2 of FIG. 11A, action(s) 1108 correspond to phase 3, action(s) 1110 correspond to phase 4, action(s) 1112 correspond to phase 5, and action(s) 1114 correspond to phase 6.

At block 1104, the complexity of an image is determined. For example, the image complexity E may be determined based on the entropy or average information of an image or, more generally, of a bit plane. At block 1104(1), the entropy of each group is calculated. At block 1104(2), the entropies are combined to produce the image complexity. For example, the group-based entropies may be summed while being weighted with regard to the number of symbols in each group.

By way of example only, block 1104(1) may be effectuated using equation (6), and block 1104(2) may be effectuated using equation (7).

At block 1106, LPS reduction ratios are determined across a range of threshold band half-widths (ThBHWs). For example, the number of LPS pixels within the threshold band for multiple values of the threshold band half-width variable may be determined. These numbers of LPS pixels within the threshold band may then be compared to a total number of LPS pixels in an image (or bit plane) to produce the LPS reduction ratios. Consequently, each respective determined LPS reduction ratio corresponds to a respective threshold band half-width $\Delta T$. By way of example only, block 1106 may be effectuated using equation (8).

At block 1108, a target bit-count is determined. For example, a target bit-count may be determined responsive to a target bit-rate R, a target frame rate f, a buffer level B, and a buffer size $B_S$. By way of example only, block 1108 may be effectuated using equation (16).

At block 1110, a threshold band is selected. For example, a threshold band may be selected by selecting a threshold band half-width responsive to a desired LPS reduction ratio, which is obtained based on a desired bit-count reduction ratio and a model parameter. At block 1110(1), a desired bit-count reduction ratio is calculated. For example, a desired bit-count reduction ratio may be calculated based on an image complexity and responsive to a targeted bit-count. By way of example only, block 1110(1) may be effectuated using equation (17).

At block 1110(2), a desired LPS reduction ratio is ascertained. For example, a desired LPS reduction ratio may be ascertained based on a desired bit-count reduction ratio and a model parameter. By way of example only, block 1110(2) may be effectuated using equation (18). At block 1110(3), a minimal threshold band half-width corresponding to an LPS reduction ratio that is not smaller than the desired LPS reduction ratio is selected. These correspondences are prepared for each bit-plane being analyzed at block 1106. By way of example only, block 1110(3) may be effectuated using equation (19).

At block 1112, a model parameter is updated. For example, the model parameter may be updated based on an actual encoding bit-count, along with the image complexity and LPS reduction ratio. At block 1112(1), an actual bit-count reduction ratio is calculated. By way of example only, block 1112(1) may be effectuated using equation (12). At block 1112(2), an interim updated model parameter is calculated. By way of example only, block 1112(3) may be effectuated using equation (13).

To further stabilize the algorithm, the (interim) updated model parameter may be constrained at block 1112(3) and/or block 1112(4). If the actions of block 1112(3) and/or block 1112(4) are omitted, the "interim" updated model parameter at block 1112(2) may be treated as the final updated model parameter. At block 1112(3), a range of the interim updated model parameter is restricted. By way of example only, block 1112(3) may be effectuated using equation (14). At block 1112(4), the restricted and updated interim model parameter is filtered with a lowpass filter to retard and/or smooth changes. By way of example only, block 1112(4) may be effectuated using equation (15).

At block 1114, skip-frame control is applied. For example, one or more frames of the video may be skipped if the buffer fill level becomes too great.

The above description is directed to the process of the model-based rate-control method from observation and verification to realization. Although it is described above in the context of bi-level video (e.g., bi-level portrait video), it may also be applied to multiple-level video (e.g., multiple-level portrait video). The following section describes how to control the rate of multiple-level video using the model-based rate-control method.

Multiple-Level Video Rate Control

Before describing a version of the rate-control method for multiple-level video, the generation and coding of multiple-level video is briefly reviewed. The relationship between bi-level video and multiple-level video and how the relationship can be utilized in rate control is then presented.

Because (i) the bit rate of 3-4 level portrait videos fits well into the bandwidth range of 20-40 kbps and (ii) if the number of levels of a multi-level video is greater than four, its compression ratio is often no longer sufficiently competitive with that of DCT-based methods, the multi-level video addressed below is directed to three-level and four-level videos. However, the principles can be extended to videos of five or more levels.

Multi-Level Video Generation and Coding

Figure 12:
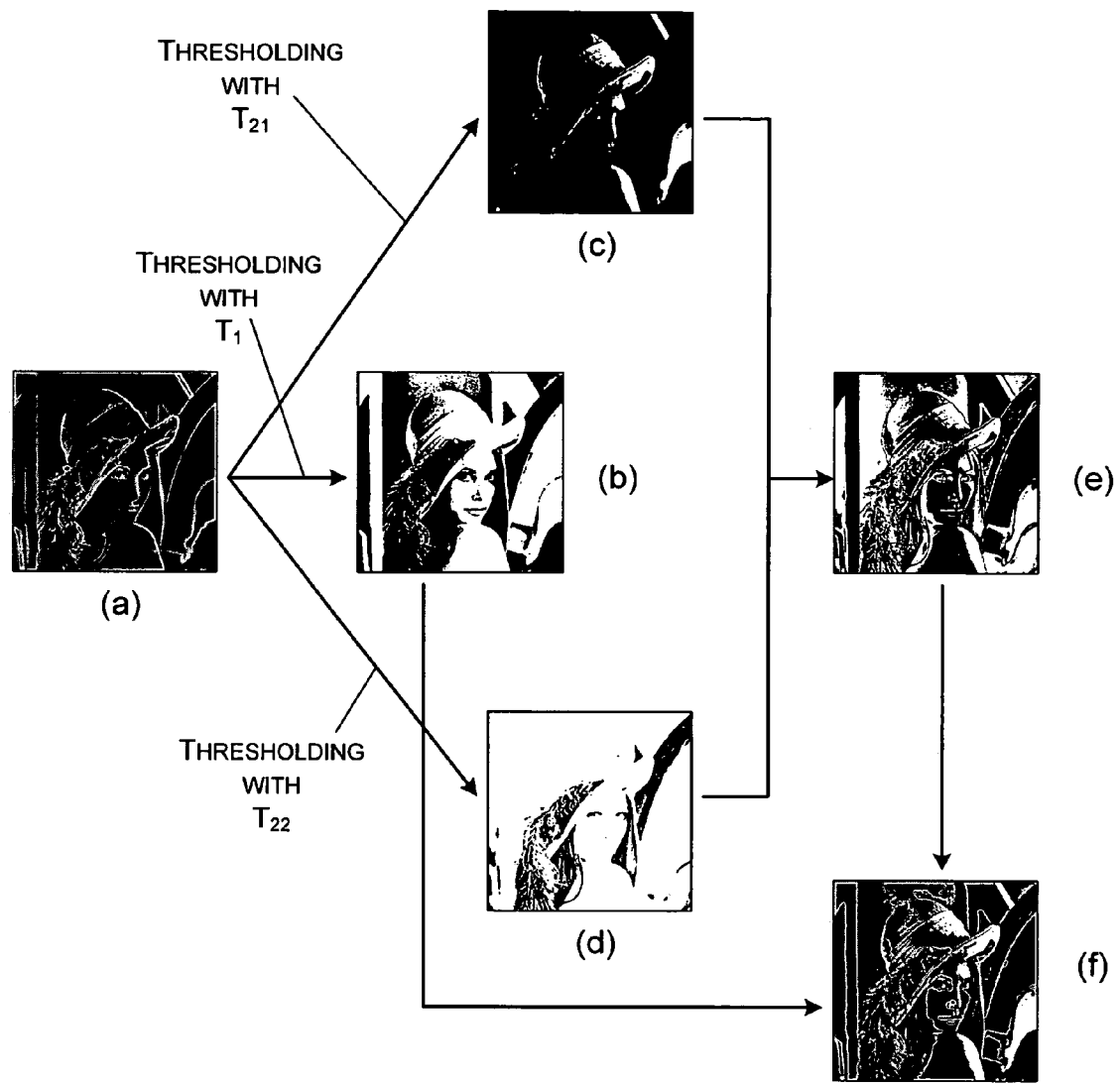
FIG. 12 illustrates an example generation of a four-level video image.

FIG. 12 illustrates an example generation of a four-level video image. Six images (a)-(f) are shown in FIG. 12. In a four-level image, each pixel is represented by two bits, so a four-level image can be regarded as two bit planes. If three thresholds, $T_{22} < T_1 < T_{21}$, are used to convert a grayscale image (a) into three bi-level images, a bi-level image (b) that is generated by the middle threshold $T_1$ is the first bit plane of the four-level image, and the second bit plane (image) (e) is composed of two bi-level images (c) and (d). These two bi-level images (c) and (d) are generated using the higher threshold $T_{21}$ and the lower threshold $T_{22}$, respectively. The two bit planes (b) and (e) comprise a four-level image (f).

During coding of a four-level image, the two bit planes are encoded individually using the aforementioned bi-level image coding method. However, because the second bit plane (e) appears complex, where some regions even appear like random noise, it is inefficient to compress such a noisy image directly. Because the two components (images (c) and (d)) of the second bit plane (e) are relatively simple, coding of the second bit plane (e) can be replaced by the combination of coding two mutually exclusive bi-level image components. In addition, extra bits to describe the regions of the image components are not needed, inasmuch as they are indicated by the first bit plane (a). Encoding the second bit plane (e) using such a bifurcated method is more efficient than coding it directly.

Generating and coding three-level video is simpler than that of four-level video because two bi-level images are generated. Moreover, the image (d) that is generated by the lower threshold is the second bit plane of the three-level image.

An empirical method is employed to select thresholds. The threshold of the first bit plane, termed the principal threshold, can be adjusted by users in a described implementation. The higher threshold and the lower threshold for the second bit plane are set as the principal threshold plus and minus 16, respectively, in this example implementation. However, these thresholds may be adjusted and/or set in alternative manners.

Multi-Level Video Rate Control

Because multi-level video coding is the coding of multiple bit planes, the above-described model-based rate-control method can be directly applied to the coding of each bit plane of a multi-level video. However, the computational cost is too expensive (e.g., as compared to the computational cost of the encoding process) if the picture complexity of each bit plane is computed. This hurdle can be overcome if the picture complexity of the multi-level image can be estimated from that of a bi-level image.

This estimation is possible because the multiple bi-level images generated by the thresholds with a distance of 16 are likely to have the same complexity. After a large number of experiments, it was discovered that the bit rates of a three-level video and a four-level video are about 1.7±0.3 and 2.7±0.3 times, respectively, that of a bi-level video. The above assumption and observation enables the defining of a function to model the relationship between the complexity of bi-level video $E_2$ and the complexity of multi-level video $E_i$ as follows in equation (21) in which Q is another model parameter.

$$\frac{E_i}{E_2} = Q, \text{ for } i = 3, 4 \quad (21.)$$

In order to examine whether this model is accurate before applying it to rate control, this model is added to the bit rate estimation process described above in the section entitled "Bit-Rate Reduction Model" to predict the coding bit count of multi-level videos. The picture complexity calculation is performed on the first bit plane but not the second. The encoding bit count of the current frame $L_a$ in (12) is replaced by the bit count of the first bit plane $L_a'$. The model parameter Q is updated as follows:

$$Q' = \frac{L_a}{L_a'} \quad (22.)$$

$$Q = \beta Q + (1-\beta)Q', \quad (23.)$$

where $L_a$ represents the bit count of the whole image, Q is initialized to 1.7 if the number of levels is three or 2.7 if the number of levels is four. Experimentation indicates that the smoothing factor β can be set to equal 0.7 to receive at least satisfactory results. However, other values for β may alternatively be used and/or β may be varied during operation. Updating this other model parameter Q can be performed in concert with actions described above with reference to block 1112 of FIG. 11B.

Figure 13A:
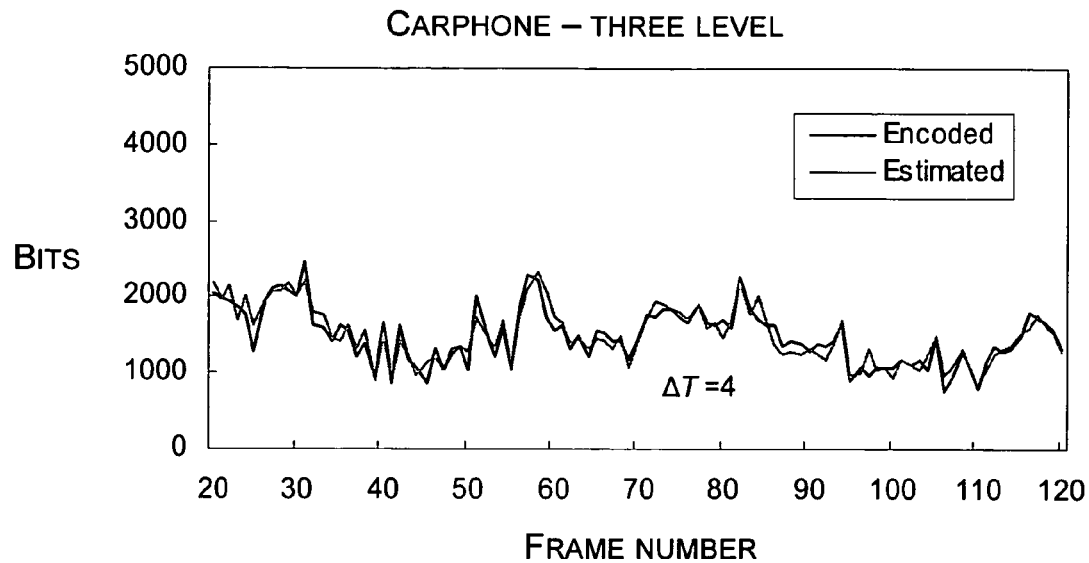
FIGS. 13A and 13B are example graphs of estimated and encoded bit counts for multi-level video.
Figure 13B:
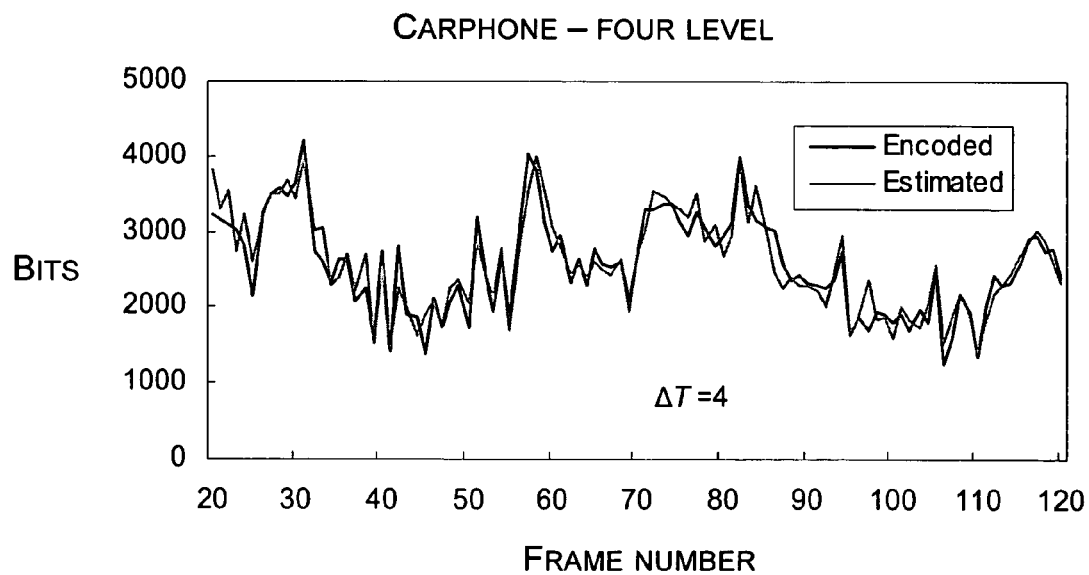

FIGS. 13A and 13B are example graphs 1300A and 1300B of estimated and encoded bit counts for multi-level video. Graphs 1300A and 1300B plot frame number versus bits for a three-level Carphone video and a four-level Carphone video, respectively. Both graphs have a half-width of the threshold bandwidth ΔT equal to 4. The lighter line represents the estimated bit counts, and the darker line represents the corresponding encoded bits.

As illustrated in FIGS. 13A and 13B, the encoding bit count of multi-level video is accurately estimated by the picture complexity of the first bit plane. The method also works well on a large number of sequences according to experimentation. The results imply that given the bit count of a multi-level image, the encoded bits of the first bit plane can be estimated using the model. This is a condition for extending the model-based rate-control method of bi-level video to multi-level video.

The multi-level functionality is integrated into the above-described model-based rate-control method to obtain the desired rate-control scheme for portrait video generally. First, in the Initialization phase, Q is initialized to 1, 1.7, or 2.7 for bi-level, three-level, or four-level videos respectively. Second, in the Threshold band width selection phase (and at block 1110(1) of FIG. 11B), the number of target bits used to calculate the desired bit-count reduction ratio in equation (17) is replaced by $L_t'$ as derived by equation (24).

$$L_t' = \frac{L_t}{Q} \quad (24.)$$

The selected threshold band half-width ΔT is applied to the coding of the one or more bit planes. Third, in the Updating LPS-Rate model phase (and at block 1112(1)), the actual encoding bit count of the first bit plane $L_a'$ is used in equation (12) to update the model parameter P, and equations (22) and (23) are incorporated into the process to update the model parameter Q.

Experimental Results

Figure 14A:
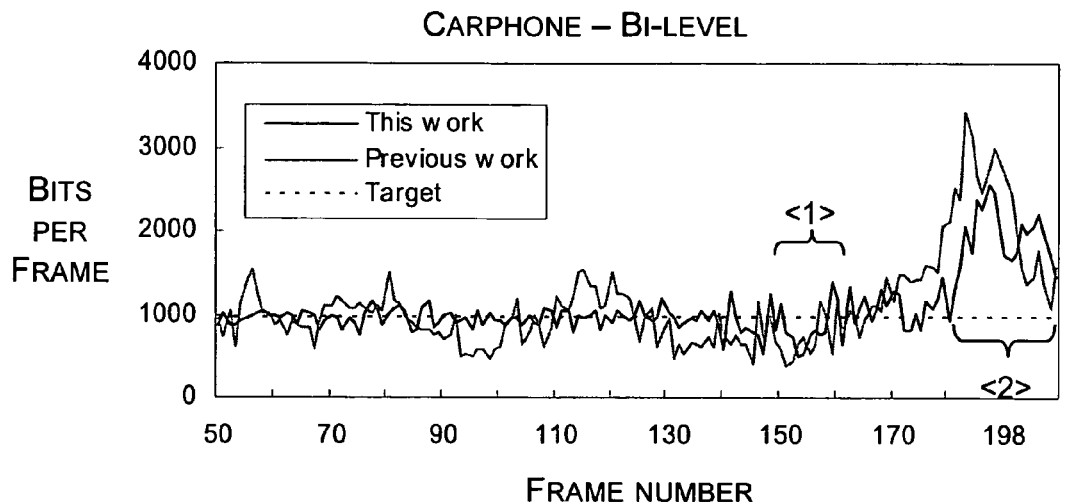
FIGS. 14A and 14B are graphs of example results of applying model-based video rate control to a sample video sequence.
Figure 14B:
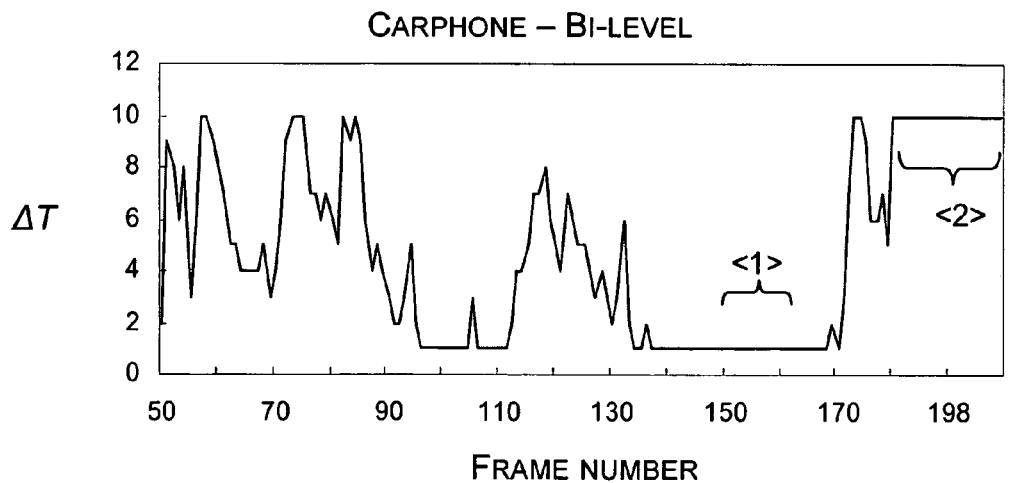

FIGS. 14A and 14B are graphs 1400A and 1400B of example results of applying model-based video rate control to a sample video sequence. The sample video sequence is the Carphone sequence with bi-level video. Graph 1400A plots frame number from 50 to 200+ versus bits per frame from 0 to 4000. Graph 1400B plots frame number from 50 to 200+ versus the half-width of the threshold band ΔT from 0 to 12.

Graph 1400A indicates a target bits per frame with a dashed line, an actual bits per frame for the previous work (e.g., semi-empirical rate control) with a gray line, and an actual bits per frame for the current work (e.g., model-based rate control) with a dark line. Graph 1400B is graphed for the current work of model-based rate control. Both graph 1400A and 1400B indicate two zones <1> and <2>.

The performance of the described model-based rate-control algorithm and the previous semi-empirical method can be compared with graph 1400A. In graph 1400A with the described algorithm, the number of bits produced by each frame matches the target value (represented by the dashed lines) better than those produced by the semi-empirical method. In most cases, the encoding bit count generated by the described algorithm slightly fluctuates near the target value.

In some cases, for example between frames 150-160 in the bi-level Carphone video of graph 1400A and as indicated by <1> in FIGS. 14A and 14B, the bit count curve of the current work is lower than the target line. However, in some other cases, for example between frames 180-200 in the bi-level Carphone video of graph 1400A and as indicated by <2> in FIGS. 14A and 14B, the bit count curve of the current work is notably higher than the target line.

These two cases can be explained by the threshold band curves of the bi-level Carphone video of graph 1400B. First, for the frames in which the encoding bit count is less than the target, their corresponding ΔT has already been set to the minimal value (as marked by <1> in graph 1400B). This indicates that the picture complexity of these frames is very low. Second, for the frames in which the number of bits notably exceeds the assignment, ΔT is at the upper bound of the control range (as marked by <2> in graph 1400B). This indicates that the picture complexity in these scenes is significantly higher than can be met by the target. Some frames are skipped by both methods in these high complexity zones to achieve the target bit rate.

The devices, actions, aspects, features, procedures, modules, components, graphs, etc. of FIGS. 1-14B are illustrated in diagrams that are divided into multiple blocks. However, the order, interconnections, interrelationships, layout, etc. in which FIGS. 1-14B are described and/or shown is not intended to be construed as a limitation, and any number of the blocks can be modified, combined, rearranged, augmented, omitted, etc. in any manner to implement one or more systems, methods, devices, procedures, media, apparatuses, arrangements, etc. for video rate control. Furthermore, although the description herein includes references to specific implementations (including a general device of FIG. 15), the illustrated and/or described implementations can be implemented in any suitable hardware, software, firmware, or combination thereof and using any suitable device architecture(s), video coding algorithms(s), threshold value(s), modeling parameter(s) and/or equation(s), level(s) of video, and so forth.

Example Operating Environment For Computer or Other Device

Figure 15:
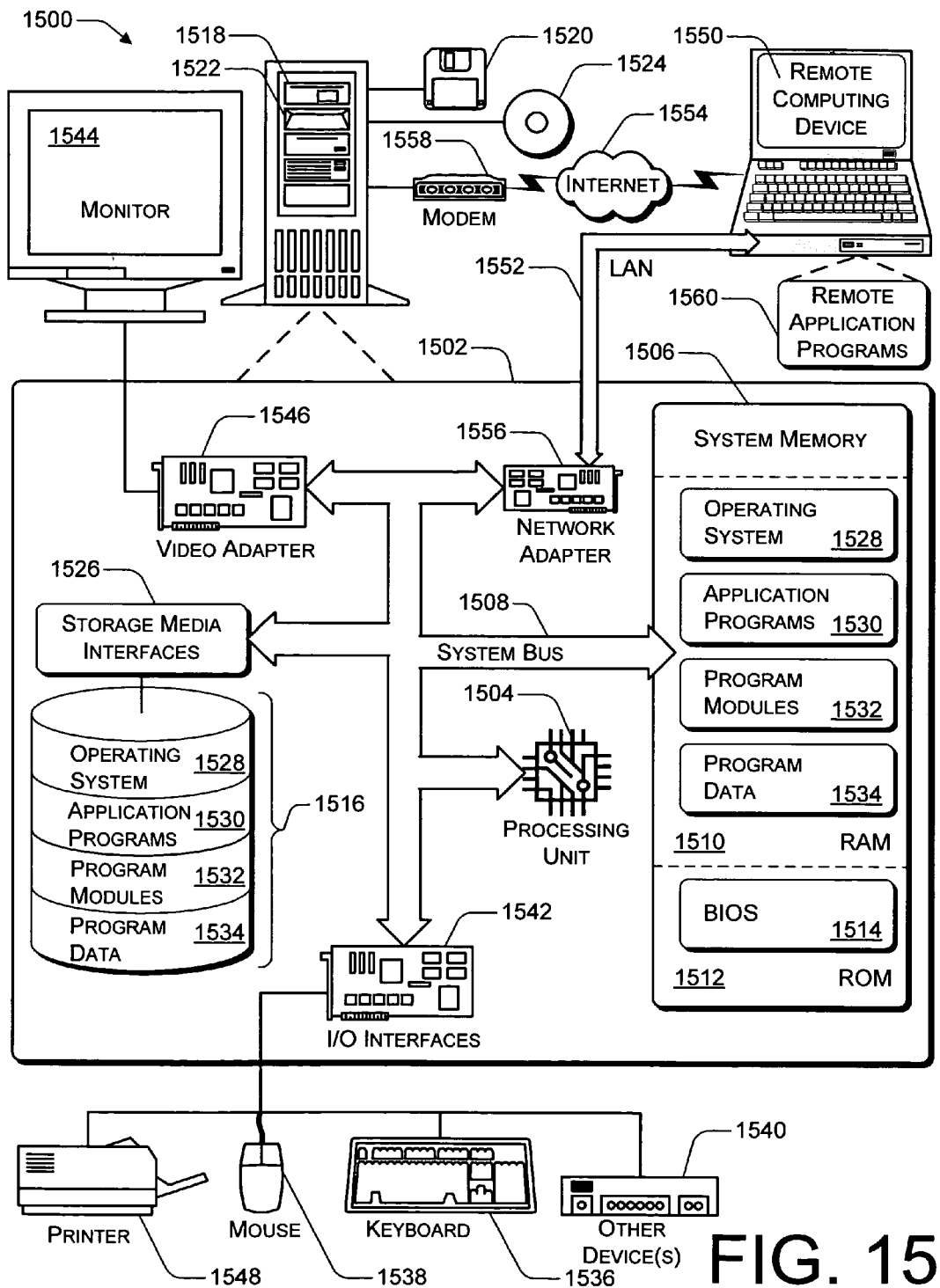
FIG. 15 illustrates an example of a computing (or general device) operating environment that is capable of (wholly or partially) implementing at least one aspect of improving video rate control as described herein.

FIG. 15 illustrates an example computing (or general device) operating environment 1500 that is capable of (fully or partially) implementing at least one system, device, apparatus, component, arrangement, protocol, approach, method, procedure, media, API, some combination thereof, etc. for video rate control as described herein. Operating environment 1500 may be utilized in the computer and network architectures described below.

Example operating environment 1500 is only one example of an environment and is not intended to suggest any limitation as to the scope of use or functionality of the applicable device (including computer, network node, entertainment device, mobile appliance, general electronic device, etc.) architectures. Neither should operating environment 1500 (or the devices thereof) be interpreted as having any dependency or requirement relating to any one or to any combination of components as illustrated in FIG. 15.

Additionally, video rate control may be implemented with numerous other general purpose or special purpose device (including computing system) environments or configurations. Examples of well known devices, systems, environments, and/or configurations that may be suitable for use include, but are not limited to, personal computers, server computers, thin clients, thick clients, personal digital assistants (PDAs) or mobile telephones, watches, hand-held or laptop devices, multiprocessor systems, microprocessor-based systems, set-top boxes, programmable consumer electronics, video game machines, game consoles, portable or handheld gaming units, network PCs, videoconferencing equipment, minicomputers, mainframe computers, network nodes, distributed or multi-processing computing environments that include any of the above systems or devices, some combination thereof, and so forth.

Implementations for video rate control may be described in the general context of processor-executable instructions. Generally, processor-executable instructions include routines, programs, protocols, objects, interfaces, components, data structures, etc. that perform and/or enable particular tasks and/or implement particular abstract data types. Controlling a video rate, as described in certain implementations herein, may also be practiced in distributed processing environments where tasks are performed by remotely-linked processing devices that are connected through a communications link and/or network. Especially but not exclusively in a distributed computing environment, processor-executable instructions may be located in separate storage media, executed by different processors, and/or propagated over transmission media.

Example operating environment 1500 includes a general-purpose computing device in the form of a computer 1502, which may comprise any (e.g., electronic) device with computing/processing capabilities. The components of computer 1502 may include, but are not limited to, one or more processors or processing units 1504, a system memory 1506, and a system bus 1508 that couples various system components including processor 1504 to system memory 1506.

Processors 1504 are not limited by the materials from which they are formed or the processing mechanisms employed therein. For example, processors 1504 may be comprised of semiconductor(s) and/or transistors (e.g., electronic integrated circuits (ICs)). In such a context, processor-executable instructions may be electronically-executable instructions. Alternatively, the mechanisms of or for processors 1504, and thus of or for computer 1502, may include, but are not limited to, quantum computing, optical computing, mechanical computing (e.g., using nanotechnology), and so forth.

System bus 1508 represents one or more of any of many types of wired or wireless bus structures, including a memory bus or memory controller, a point-to-point connection, a switching fabric, a peripheral bus, an accelerated graphics port, and a processor or local bus using any of a variety of bus architectures. By way of example, such architectures may include an Industry Standard Architecture (ISA) bus, a Micro Channel Architecture (MCA) bus, an Enhanced ISA (EISA) bus, a Video Electronics Standards Association (VESA) local bus, a Peripheral Component Interconnects (PCI) bus also known as a Mezzanine bus, some combination thereof, and so forth.

Computer 1502 typically includes a variety of processor-accessible media. Such media may be any available media that is accessible by computer 1502 or another (e.g., electronic) device, and it includes both volatile and non-volatile media, removable and non-removable media, and storage and transmission media.

System memory 1506 includes processor-accessible storage media in the form of volatile memory, such as random access memory (RAM) 1510, and/or non-volatile memory, such as read only memory (ROM) 1512. A basic input/output system (BIOS) 1514, containing the basic routines that help to transfer information between elements within computer 1502, such as during start-up, is typically stored in ROM 1512. RAM 1510 typically contains data and/or program modules/instructions that are immediately accessible to and/or being presently operated on by processing unit 1504.

Computer 1502 may also include other removable/non-removable and/or volatile/non-volatile storage media. By way of example, FIG. 15 illustrates a hard disk drive or disk drive array 1516 for reading from and writing to a (typically) non-removable, non-volatile magnetic media (not separately shown); a magnetic disk drive 1518 for reading from and writing to a (typically) removable, non-volatile magnetic disk 1520 (e.g., a "floppy disk"); and an optical disk drive 1522 for reading from and/or writing to a (typically) removable, non-volatile optical disk 1524 such as a CD, DVD, or other optical media. Hard disk drive 1516, magnetic disk drive 1518, and optical disk drive 1522 are each connected to system bus 1508 by one or more storage media interfaces 1526. Alternatively, hard disk drive 1516, magnetic disk drive 1518, and optical disk drive 1522 may be connected to system bus 1508 by one or more other separate or combined interfaces (not shown).

The disk drives and their associated processor-accessible media provide non-volatile storage of processor-executable instructions, such as data structures, program modules, and other data for computer 1502. Although example computer 1502 illustrates a hard disk 1516, a removable magnetic disk 1520, and a removable optical disk 1524, it is to be appreciated that other types of processor-accessible media may store instructions that are accessible by a device, such as magnetic cassettes or other magnetic storage devices, flash memory, compact disks (CDs), digital versatile disks (DVDs) or other optical storage, RAM, ROM, electrically-erasable programmable read-only memories (EEPROM), and so forth. Such media may also include so-called special purpose or hard-wired IC chips. In other words, any processor-accessible media may be utilized to realize the storage media of the example operating environment 1500.

Any number of program modules (or other units or sets of processor-executable instructions) may be stored on hard disk 1516, magnetic disk 1520, optical disk 1524, ROM 1512, and/or RAM 1510, including by way of general example, an operating system 1528, one or more application programs 1530, other program modules 1532, and program data 1534. These program modules may include one or more such modules that implement at least one aspect of video rate control as described herein above.

A user may enter commands and/or information into computer 1502 via input devices such as a keyboard 1536 and a pointing device 1538 (e.g., a "mouse"). Other input devices 1540 (not shown specifically) may include a microphone, joystick, game pad, satellite dish, serial port, video camera, scanner, and/or the like. These and other input devices are connected to processing unit 1504 via input/output interfaces 1542 that are coupled to system bus 1508. However, input devices and/or output devices may instead be connected by other interface and bus structures, such as a parallel port, a game port, a universal serial bus (USB) port, an infrared port, an IEEE 1394 ("Firewire") interface, an IEEE 802.11 wireless interface, a Bluetooth® wireless interface, and so forth.

A monitor/view screen 1544 or other type of display device may also be connected to system bus 1508 via an interface, such as a video adapter 1546. Video adapter 1546 (or another component) may be or may include a graphics card for processing graphics-intensive calculations and for handling demanding display requirements. Typically, a graphics card includes a graphics processing unit (GPU), video RAM (VRAM), etc. to facilitate the expeditious display of graphics and performance of graphics operations. In addition to monitor 1544, other output peripheral devices may include components such as speakers (not shown) and a printer 1548, which may be connected to computer 1502 via input/output interfaces 1542.

Computer 1502 may operate in a networked environment using logical connections to one or more remote computers, such as a remote computing device 1550. By way of example, remote computing device 1550 may be a peripheral device, a personal computer, a portable computer (e.g., laptop computer, tablet computer, PDA, mobile station, etc.), a palm or pocket-sized computer, a watch, a gaming device, a server, a router, a network computer, a peer device, another network node, or another device type as listed above, and so forth. However, remote computing device 1550 is illustrated as a portable computer that may include many or all of the elements and features described herein with respect to computer 1502.

Logical connections between computer 1502 and remote computer 1550 are depicted as a local area network (LAN) 1552 and a general wide area network (WAN) 1554. Such networking environments are commonplace in offices, enterprise-wide computer networks, intranets, the Internet, fixed and mobile telephone networks, ad-hoc and infrastructure wireless networks, mesh networks, other wireless networks, gaming networks, some combination thereof, and so forth. Such networks and logical and physical communications connections are additional examples of transmission media.

When implemented in a LAN networking environment, computer 1502 is usually connected to LAN 1552 via a network interface or adapter 1556. When implemented in a WAN networking environment, computer 1502 typically includes a modem 1558 or other component for establishing communications over WAN 1554. Modem 1558, which may be internal or external to computer 1502, may be connected to system bus 1508 via input/output interfaces 1542 or any other appropriate mechanism(s). It is to be appreciated that the illustrated network connections are examples and that other manners for establishing communication link(s) between computers 1502 and 1550 may be employed.

In a networked environment, such as that illustrated with operating environment 1500, program modules or other instructions that are depicted relative to computer 1502, or portions thereof, may be fully or partially stored in a remote media storage device. By way of example, remote application programs 1560 reside on a memory component of remote computer 1550 but may be usable or otherwise accessible via computer 1502. Also, for purposes of illustration, application programs 1530 and other processor-executable instructions such as operating system 1528 are illustrated herein as discrete blocks, but it is recognized that such programs, components, and other instructions reside at various times in different storage components of computing device 1502 (and/or remote computing device 1550) and are executed by processor(s) 1504 of computer 1502 (and/or those of remote computing device 1550).

Although systems, media, devices, methods, procedures, apparatuses, techniques, schemes, approaches, procedures, arrangements, and other implementations have been described in language specific to structural, logical, algorithmic, and functional features and/or diagrams, it is to be understood that the invention defined in the appended claims is not necessarily limited to the specific features or diagrams described. Rather, the specific features and diagrams are disclosed as exemplary forms of implementing the claimed invention.

What is claimed is:

1. A video encoder device that implements a model-based rate control mechanism for encoding of bit planes, the video encoder device comprising:
   one or more processors; and
   one or more processor-accessible storage media storing processor-executable instructions for implementing a plurality of modules for implementing the model-based rate control mechanism for encoding of bit planes, the plurality of modules comprising:
   a pre-encoding module for accepting a current bit plane and a model parameter, the model parameter reflecting a less probable symbol (LPS) reduction ratio with respect to bits of a bit plane and a bit-count reduction ratio due to bit plane encoding, wherein the pre-encoding module produces a value for a threshold band half-width using the model parameter to determine a desired LPS reduction ratio;
   an encoding module that receives the value for the threshold band half-width produced by the pre-encoding module, and that also receives the current bit plane for producing an encoded bit plane having a reduced bit count based on the value for the threshold band half-width produced by the pre-encoding module using the model parameter; and a post-encoding module for accepting the encoded bit plane from the encoding module, the encoded bit plane having been encoded responsive to the value for the threshold band half-width produced by the pre-encoding module using the model parameters, wherein the post-encoding module updates the model parameter based on an actual bit-count reduction ratio derived from the encoded bit plane and provides the updated model parameter to the pre-encoding module for use in processing a next bit plane.

2. The device as recited in claim 1, wherein the device comprises (i) a mobile telephone, (ii) video conferencing equipment, or (iii) at least part of a personal computer.

3. The device as recited in claim 1
wherein the pre-encoding module ascertains the desired LPS reduction ratio responsive to the model parameter and a desired bit-count reduction ratio; and
wherein the pre-encoding module selects a smallest value for the threshold band half-width in which a corresponding LPS reduction ratio is larger than or equal to the desired LPS reduction ratio.

4. The device as recited in claim 3,
wherein the current bit plane comprises a first bit plane of a multi-level video frame; and
wherein the pre-encoding module calculates the desired bit-count reduction ratio based on a targeted bit-count for the first bit plane and responsive to another model parameter.

5. The device as recited in claim 1
wherein the post-encoding module is further adapted to calculate the actual bit-count reduction ratio responsive to an encoding bit-count of the encoded bit plane and a complexity of the current bit plane; and
wherein the post-encoding module updates the model parameter based on the actual bit-count reduction ratio and the LPS reduction ratio to provide the updated model parameter to the pre-encoding module.

6. A method comprising:
determining multiple less probable symbol (LPS) reduction ratios across a range of multiple threshold band half-widths, each respective LPS reduction ratio of the multiple LPS reduction ratios corresponding to a respective threshold band half-width of the multiple threshold band half-widths;
determining a targeted bit-count for a current bit plane;
calculating a desired bit-count reduction ratio using the targeted bit-count for the current bit plane and a complexity of the current bit plane;
ascertaining a desired LPS reduction ratio based on the desired bit-count reduction ratio and responsive to a model parameter; and
selecting a minimal respective threshold band half-width from among the multiple threshold band half-widths such that the corresponding respective LPS reduction ratio of the multiple LPS reduction ratios is not smaller than the desired LPS reduction ratio.

7. The method as recited in claim 6, further comprising:
calculating an actual bit-count reduction ratio for the current bit plane;
calculating an interim updated model parameter from the model parameter using the actual bit-count reduction ratio for the current bit plane; and
constraining the interim updated model parameter.

8. The method as recited in claim 6, further comprising:
updating another model parameter based on a bit count of a single bit plane of a multiple-bit-plane image and a bit count of an entirety of the multiple-bit-plane image.

9. The method as recited in claim 6, further comprising:
receiving the selected minimal respective threshold band half-width value as input for encoding the current bit plane;
producing an encoded bit plane from the current bit plane, wherein the encoded bit plane is encoded to have a reduced bit count based on the input of the selected minimal respective threshold band half-width value;
updating the model parameter based on an actual bit count reduction ratio of the encoded bit plane.

10. The method as recited in claim 9, wherein
the determining the multiple less probable symbol (LPS) reduction ratios, the determining the targeted bit-count for the current bit plane, the calculating the desired bit-count reduction ratio, the ascertaining the desired LPS reduction ratio, and the selecting the minimal respective threshold band half-width is carried out by a pre-encoding module;
the receiving the selected minimal respective threshold band half-width value as input, and the producing an encoded bit plane from the current bit plane are carried out by an encoding module; and
the updating the model parameter based on an actual bit count reduction ratio is carried out by a post-encoding module that provides the updated model parameter to the pre-encoding module.

11. A device comprising:
one or more processors; and
one or more processor-accessible storage media storing processor-executable instructions implemented by the one or more processors for carrying out acts comprising:
initializing a model parameter, a buffer size, and a buffer fill level, wherein the model parameter comprises a ratio of a less probable symbol (LPS) reduction ratio and a bit-count reduction ratio;
calculating a complexity of a bit plane of an image;
calculating a plurality of less probable symbol (LPS) reduction ratios across a range of threshold band half-widths so that each LPS reduction ratio corresponds to one of a plurality of threshold band half-widths within the range;
calculating a targeted bit-count based on a target frame rate and the buffer size; and
selecting a threshold band half-width from the plurality of threshold band half-widths, each respective threshold band half-width of the plurality of threshold band half-widths corresponding to one of the respective LPS reduction ratios of the plurality of LPS reduction ratios, wherein the selecting is responsive to a desired LPS reduction ratio that reflects a desired bit-count reduction ratio, wherein the desired LPS reduction ratio, further reflects the specified model parameter, wherein the desired bit-count reduction ratio is derived from the calculated targeted bit-count, wherein in the selecting the threshold band half-width further comprises:
calculating the desired bit-count reduction ratio using the targeted bit-count and the complexity of the bit plane;
ascertaining the desired LPS reduction ratio based on the desired bit-count reduction ratio and the specified model parameter;
selecting a minimal respective threshold band half-width, from among the plurality of threshold band half-widths, that corresponds to a respective LPS reduction ratio, from among the plurality of LPS reduction ratios calculated, that is not smaller than the desired LPS reduction ratio;

providing the selected minimal respective threshold band half-width for use in encoding the bit plane;

encoding the bit plane based on the selected minimal threshold band half-width to produce an encoded bit plane;

calculating an actual bit count reduction ratio from the encoded bit plane;

calculating an interim updated model parameter based on the actual bit count reduction ratio calculated from the encoded bit plane;

smoothing the calculated interim updated model parameter to produce an updated model parameter; and providing the updated model parameter for processing a next bit plane.

12. The device as recited in claim 11, wherein the initializing further comprises initializing another model parameter in dependence on a level of video being encoded, wherein the other model parameter represents a relationship between an entropy-based complexity of a first bit plane of the image and an entropy-based complexity of an entirety of the image.

13. The device as recited in claim 11, further comprising determining a fill level of the buffer; and applying skip frame control when the fill level of the buffer exceeds a predetermined level.

14. The device as recited in claim 11, wherein the device comprises one of:
a mobile telephone;
video conferencing equipment; or
at least part of a personal computer.

15. One or more processor-accessible storage media comprising processor-executable instructions that, when executed, direct a device to perform actions comprising:

determining an entropy-based complexity of a bit plane of an image;

determining a targeted bit-count for the bit plane of the image;

selecting a threshold band half-width based on a desired bit-count reduction ratio and a model parameter, by:

calculating the desired bit-count reduction ratio using the targeted bit-count and the complexity of the bit plane;

ascertaining a desired LPS reduction ratio based on the desired bit-count reduction ratio and the model parameter;

selecting a minimal respective threshold band half-width, from among a plurality of threshold band half-widths, that corresponds to a respective LPS reduction ratio, from among a plurality of LPS reduction ratios calculated, that is not smaller than the desired LPS reduction ratio;

encoding the bit plane based on the selected minimal threshold band half-width to produce an encoded bit plane;

calculating an updated model parameter based on the encoded bit plane; and providing the updated model parameter for processing a next bit plane.

16. The one or more processor-accessible media as recited in claim 15, wherein the bit-plane comprises (i) an image frame for bi-level video or (ii) a portion of an image frame for multi-level video.

17. The one or more processor-accessible media as recited in claim 15
wherein the selecting the threshold band half-width further comprises selecting the threshold band half-width based on the desired bit-count reduction ratio, the model parameter, and another model parameter,
wherein the other model parameter represents a relationship between an entropy-based complexity of a first bit plane of an image and an entropy-based complexity of an entirety of the image.

18. The one or more processor-accessible media as recited in claim 15, wherein the determining the targeted bit-count rate further comprises determining the targeted bit-count based on a targeted bit-rate and a targeted frame rate.

19. The one or more processor-accessible media as recited in claim 15, wherein the determining the targeted bit-count rate further comprises determining the targeted bit-count responsive to at least one of a buffer fill level or a buffer size.

20. The one or more processor-accessible media as recited in claim 15, wherein the processor-executable instructions, when executed, direct the device to perform a further action comprising:
determining a respective less probable symbol (LPS) reduction ratio for each corresponding respective threshold band half-width of multiple threshold band half-widths.

21. The one or more processor-accessible media as recited in claim 15, wherein the determining the entropy-based complexity of the bit plane comprises:
calculating respective entropies for respective groups of multiple groups of context values; and
combining the respective entropies to produce the complexity of the bit plane.

22. The one or more processor-accessible media as recited in claim 15, wherein the updating the model parameter further comprises:
calculating an actual bit-count reduction ratio using an encoding bit-count; and
calculating the updated model parameter based on the actual bit-count reduction ratio.

23. The one or more processor-accessible media as recited in claim 15, wherein the processor-executable instructions, when executed, direct the device to perform further actions comprising:
updating a buffer fill level after encoding a frame and forwarding a bistream and
applying skip-frame control if the buffer fill level exceeds a predetermined level.

* * * * *